United States Patent [19]
Hess, Jr.

[11] Patent Number: 5,311,440
[45] Date of Patent: May 10, 1994

[54] METHODS AND APPARATUS FOR CORRECTION OF CABLE VARIATIONS

[75] Inventor: Doren W. Hess, Jr., Norcross, Ga.

[73] Assignee: Scientific-Atlanta, Inc., Atlanta, Ga.

[21] Appl. No.: 801,052

[22] Filed: Dec. 3, 1991

[51] Int. Cl.$^5$ ............................................. H04B 9/00
[52] U.S. Cl. ................................... 364/481; 324/612; 324/615; 364/550; 364/553
[58] Field of Search ................... 324/539, 615, 616; 364/481, 484, 487, 550, 553; 455/226.4, 612

[56] References Cited

U.S. PATENT DOCUMENTS

| | | |
|---|---|---|
| 3,206,672 | 9/1965 | Gouriet et al. |
| 3,243,699 | 3/1966 | Kummer |
| 3,395,340 | 7/1968 | Anstey et al. |
| 3,474,336 | 10/1969 | Alford |
| 3,483,467 | 12/1969 | Bates, Jr. |
| 3,526,834 | 9/1970 | Brown |
| 3,646,432 | 2/1972 | Nakai et al. ........................ 324/616 |
| 4,087,657 | 5/1978 | Peoples ............................... 324/615 |
| 4,264,859 | 4/1981 | Blaess ................................. 324/615 |
| 4,264,959 | 4/1981 | Bläss .................................. 364/487 |
| 4,275,348 | 6/1981 | Bayer et al. ......................... 324/615 |
| 4,290,008 | 9/1981 | Hoshino et al. ..................... 324/615 |
| 4,290,010 | 9/1981 | Blaess et al. ........................ 379/24 |
| 4,511,377 | 5/1992 | Finman ................................ 364/481 |
| 4,887,313 | 12/1989 | Luke et al. .......................... 455/612 |
| 4,958,294 | 9/1990 | Herscher et al. .................... 364/484 |
| 4,959,792 | 9/1990 | Sullivan ............................... 364/481 |

OTHER PUBLICATIONS

"A New Method for Correcting Phase Errors Caused By Flexing of Cables in Antenna Measurements", by J. Tuovinen, A. Lehto, and A. Raisanen, *IEEE Transactions On Antennas and Propagation*, vol. 39, No. 6, Jun. 1991, pp. 859–861.

"Phase Reference Cable", by D. Slater, *Near-Field Antenna Measurements*, Section 4.3, pp. 66–75, Artech House, 1991.

Excerpt from "Planar Near-Field Measurements", A. Newell, *Lecture Notes from NIST Short Course*, Jun. 1985, pp. 34–35 and FIGS. 20–21.

"Determination of Both Polarization and Power Gain of Antennas by Generalized 3-Antenna Measurement Method", A. Newell and D.Kerns, *Electronics Letters*, vol. 7, No. 3, Feb. 11, 1971, pp. 68–70.

"Accurate Measurement of Antenna Gain and Polarization at Reduced Distances By an Extrapolation Technique", A. Newell, R. Baird, and P. Wacker, *IEEE Transactions On Antennas and Propagation*, vol. AP-21, No. 4, Jul. 1973, pp. 418–431.

"A Practical Method for Measuring the Complex Polarization Ratio of Arbitrary Antennas", E. Joy and D. Paris, *IEEE Transactions on Antennas and Propagation*, vol. AP-21, No. 4, Jul. 1973, pp. 432–435.

"Measurement on Gain", T. Hickman and R. Heaton, *Microwave Antenna Measurements*, Chapter 8, Section 8.1, pp. 8-1 through 8-9, Scientific-Atlanta, Inc., Atlanta, Ga., 1970.

*Primary Examiner*—Kevin J. Teska
*Attorney, Agent, or Firm*—Jones & Askew

[57] ABSTRACT

Methods and apparatus are described for automatically determining correction factors for an electrical device to compensate for variations in the device as a result of mechanical and/or environmental influences, using a "three cable" method. A primary cable is used to conduct signals between electrical devices, for example a probe antenna and an antenna under test ("AUT") in an antenna test range. The primary cable is subjected to mechanical and/or environmental influences such as cable flexing and temperature changes. A first secondary cable and a second secondary cable are provided alongside the primary cable, and are subjected to similar environmental influences. A switching network connects the primary cable, the first secondary cable, and the second secondary cable in combinations to form three cable pairs during a calibration mode. A computing system determines insertion factors associated with the primary cable at a first time and a second time, using transfer functions associated with the cable pairs. A correction factor is determined using the insertion factors associated with the primary cable at the first time and the second time. The correction factor is applied to data transmitted via the primary cable during use of the primary cable in an antenna measurement mode, to compensate or adjust for the mechanical and/or environmental influences upon the primary cable.

58 Claims, 12 Drawing Sheets

METHODS AND APPARATUS FOR CORRECTION OF CABLE VARIATIONS

TECHNICAL FIELD

The present invention relates generally to antenna and network measurements, and relates more particularly to methods and apparatus for automatically determining correction factors for an electrical cable used in an antenna measurement system to compensate for variations in the cable as a result of mechanical and/or environmental influences, using a "three cable" method.

BACKGROUND OF THE INVENTION

Electrical cables are typically used to pass signals between antennas and test equipment in an antenna test range or test room. An electrical cable that passes a signal between two separate locations is subject to mechanical and/or environmental influences such as temperature, motion, pressure, humidity, and deformation, etc. that affect the electrical characteristics of the cable. The accuracy of measurements of the electrical parameters of signals carried by a cable is undesirably affected by such environmental influences on the cable. Inaccurate measurements of cable signals result in inaccurate conclusions about devices connected to the cables. Such environmental influences degrade the accuracy of measurement data acquired via the measurement cable unless the measurement error induced by the cable variation is minimized prior to the measurement data acquisition or the measurement error is eliminated by post-processing of the measurement data.

For example, a planar near-field measurement system conducts precise measurements of the characteristics of an antenna-under-test ("AUT") by moving a probe antenna along an x-y plane located approximately parallel to the wavefront of the AUT to conduct a series of discrete measurements of the AUT. Similarly, a spherical near-field measurement system conducts antenna measurements by moving the AUT in both azimuth and elevation to scan the fixed probe antenna. For either implementation, a near-field measurement system utilizes a moving antenna to conduct antenna measurement operations. In general, the moving antenna is connected to stationary measurement instrumentation by at least one measurement cable, for example, a test signal cable. However, the motion of the moving antenna disrupts the phase and amplitude stability of the test signal cable by flexing the test signal cable. Similarly, changes in the ambient temperature of the test signal cable corrupt the accuracy of a test signal carried by the cable.

Measurement errors induced by environmental influences on the test signal cable cause post-processing errors during the transformation of the near-field measurement data to far-field data and, consequently, introduce errors for the measurement of the characteristics of the AUT. In particular, these errors degrade the accuracy of the measurement of low sidelobe levels for the AUT because sidelobe measurements require extremely accurate phase measurements.

A variety of methods have been proposed to reduce the measurement errors attributable to cable variations. Typically, cable variation errors are minimized for measurement systems, specifically near-field measurement systems, by carefully selecting the type of cable carrying a measurement signal such as the test signal. For example, a flexible coaxial cable, such as a polyetrafluoroethylene (PTFE) cable, is preferred for the test signal cable. This nearly phase stable cable is typically routed along the structure that supports the moving antenna. Careful routing controls the bending radius of the cable and ensures a stable cable location as a function of moving antenna position. The placement of the flexible cable along the support structure requires careful attention to avoid placing the cable in a state of tension or compression at any point along the cable path of motion for the moving antenna.

Nevertheless, the use of a PTFE cable as the test signal cable for a near-field measurement system is complicated by the requirement for a complex mechanical structure to control cable flexure. Furthermore, the effective cable lifespan for a nearly phase stable cable is limited by the flexing of the cable occurring during the movement of the moving antenna.

Other approaches for minimizing the cable variations associated with a test signal cable include the use of semirigid coaxial cable that is typically supported by a set of articulated support arms which are connected to the moving probe antenna in a planar near-field measurement system. A rotary joint having a known phase stability characteristic is typically used to bridge the joint at each articulated arm. Alternatively, flexible coaxial cable jumpers or a loop of thin diameter semirigid cable have been utilized to bridge the joints and provide a continuous signal path between the moving antenna and the measurement instrumentation. Likewise, a combination of semirigid coaxial cable and rotary joints also is utilized to bridge the moving components associated with a turntable that supports and rotates the AUT in a spherical near-field measurement system.

A semirigid cable remains fixed relative to the motion of the moving antenna, thereby minimizing any motion-induced errors in the test signal path. However, typical semirigid cables have a relatively high temperature coefficient of approximately 80 parts per million per degree (ppm/degree) Centigrade, rendering them susceptible to temperature induced errors. For precise measurements, semirigid cables have been found to exhibit less than optimum phase stability during changes in the ambient temperature upon the cable.

It is expected that fiber optic cables will be used in the future to transmit test signals between the instrumentation and the moving antenna. However, fiber optic cable based systems are still in the development stage. At present, the phase stability of fiber optic cables varies widely, and is similar to that of PFTE cables. Consequently, the performance of fiber optic cables does not offer a sufficient advantage over PFTE cable to justify the additional expense of the fiber optic transmitters and receivers required for a fiber optic implementation of a test signal cable.

Measurement errors induced by cable variation during antenna system and network system measurements, including near-field measurements, also can be directly measured and thereby provide data useful in compensating for such errors. One technique for the measurement of phase error induced by cable variation is described in "Planar Near-Field Measurements" by A. Newell of the National Institute of Standards (NIST), pages 34-35, dated June 1985. The Newell technique introduces a calibration signal at a first end of a test signal cable and inserts a significant mismatch by use of a stub tuner at the other end of the test signal cable. The mismatch generates a signal reflection of the calibration signal; the reflection returns to the first end of the cable and is measured by a microwave bridge. The microwave bridge compares the calibration signal to the reflection signal to determine phase errors influenced by environmental effects.

An alternative method for correcting phase errors caused by the flexing of a test signal cable is described in "A New Method for Correcting Phase Errors Caused by Flexing of Cables in Antenna Measurements", by J. Tuovinen, A. Lehto, and A. Raisanen, IEEE *Trans. Antennas and Propagation*, Vol. 39, No. 6, June 1991, pages 859–861. Similar to the Newell technique, the measurement system measures the phase of a signal passing twice the length of a flexible cable by injecting a calibration signal at one end of the test signal cable and measuring a reflection signal generated by a mismatch at the other end of the cable. A short-circuited directional coupler is used to provide the mismatch while also providing a proper match for the moving antenna connected at the other end of the cable. Scattering parameters, the input reflection coefficient, and other parameters are measured by a network analyzer to determine the phase change. The phase error determined in this manner is then removed from the antenna measurement data associated with the AUT by post processing of the measurement data.

Both the Newell and Tuovinen measurement schemes rely upon the measurement of a reflection signal to determine the phase errors for a cable in question. However, it is well known that signal reflections other than the desired reflection signal are generated by other discontinuities in a cable. Consequently, the measurement of the reflection signal also includes the measurement of spurious return signals that corrupt the measurement of the desired reflection signal. Furthermore, the desired reflection signal, which is produced by reflecting the calibration signal from a mismatch located at the far end of the cable, is greatly attenuated for a long cable length because the signal traverses the cable twice (down to the mismatch and back) prior to measurement, effectively providing a two-way signal path. For the Tuovinen measurement technique, the presence of a leakage signal, introduced by the directional coupler as a result of the insufficiently high directivity of the directional coupler, further complicates an accurate measurement of the desired reflection because the leakage signal may have a larger amplitude than the attenuated reflection signal for a long cable length. In addition, the Newell and Tuovinen measurement techniques are limited to the measurement of phase errors, and not amplitude errors, induced by environmental influences upon an electrical cable.

To accurately compensate antenna measurement data acquired via the test signal cable, the Newell and Tuovinen techniques require measurements to determine the phase error induced by environmental influences upon the test signal cable. However, the rate of cable variation may exceed the rate of calibration data acquisition associated with the measurements of the phase error by the use of conventional instrumentation. Accordingly, it would be beneficial to automate the measurements of the phase error by the use of a controllable measurement instrument and to increase the speed of calibration data acquisition.

New measurement receivers having multiple measurement channels are now available that perform automatic measurements and computations at a significantly higher data acquisition and processing rate than available from other currently available conventional systems. In particular, the Model 1795 microwave receiver marketed by Scientific Atlanta, Inc., assignee of the present invention, provides the automatic measurement of both phase and amplitude data from the test signal cable to increase the measurement acquisition speed for the calibration measurements. Such an automated microwave receiver leads to the requirement for a method to determine the errors induced by cable variation in a manner that takes complete advantage of the automated measurement and processing capabilities of the Scientific Atlanta 1795 receiver.

Accordingly, there is a need for measurement methods that permit the errors induced by environmental influences upon an electrical device to be measured in a one-way transmission path without introducing the spurious reflection signal or leakage signal difficulties resulting from use of a two-way signal path. In addition, there is a need for a method of determining such errors to permit the systematic calibration of measurements acquired from the electrical device. There is also a need for a system for automatically determining errors induced by environmental influences upon an electrical device, such as an electrical cable, and for providing a correction factor to enable the correction of measurement data acquired from the electrical device. In particular, there is a need for a system for automatically determining errors induced by cable flexure, changes of ambient temperature, and other environmental influences upon an electrical cable.

Furthermore, there is a need for a system that provides a correction factor that can be automatically applied to measurement data acquired from an electrical cable and thereby enable the correction of cable variations for such measurement data. There is also a need for automatically determining errors attributable to cable flexure, changes of ambient temperature, and other mechanical and/or environmental influences upon an electrical cable and, furthermore, for providing a correction factor to correct measurement data acquired by the electrical cable without a priori knowledge concerning the electrical characteristics of the electrical cable. There is also a general need for automatically determining and compensating for errors induced by deforming mechanical perturbations or influences such as bending, twisting, flexing, linear motion, or rotary motion, and by environmental perturbations or influences such as temperature, humidity, and fluid pressure variations, upon an electrical cable that connects a measurement instrument to a remotely located sensor.

Finally, there is a need for more rapidly determining errors induced by environmental influences upon an electrical cable utilized to carry a test signal between a moving antenna and measurement instrumentation located within a near-field antenna measurement range and, furthermore, for calculating a correction factor to provide for corrected measurements of an AUT.

SUMMARY OF THE INVENTION

The foregoing needs for an automatic measurement system are satisfied by the present invention, which automatically determines a correction factor for a primary electrical device, such as an electrical cable used in antenna measurement systems, to compensate for mechanical and/or environmental influences upon the primary electrical device. Briefly described, then, the present invention provides automatic measurement systems and methods that determine a correction factor for a primary electrical device such as an electrical cable, by solving a set of equations established by measurements of a plurality of independent pairs of similar electrical devices, wherein each device, including the primary electrical device, is subjected to the same influences. A resultant signal, produced by successively applying a known calibration signal to each of the pairs of electrical devices, is measured to establish a plurality of equations with a plurality of unknown parameters. The solutions of these equations determine the correction factor necessary to compensate for the influences upon the primary electrical device.

More particularly described, the present invention provides methods and apparatus for determining a characteristic associated with a primary confined path signal transmitting device, such as an electrical cable, subjected to a mechanical and/or environmental influence. The mechanical and/or environmental influences include flexing, twisting, extending, straining, compressing, deforming, or otherwise altering the cable, or temperature, pressure, humidity, or other influences affecting the transfer characteristics of the cable.

A plurality of other confined path signal transmitting devices, also subjected to the mechanical and/or environmental influence, are provided. Means are provided for connecting the primary confined path signal transmitting device and the plurality of other confined path signal transmitting devices to form coupled pairs of the devices. Finally, means are provided for comparing signals transmitted through the pairs of devices to determine a characteristic associated exclusively with the primary confined path signal device.

The signals transmitted through the pairs of devices comprise calibration signals normalized to a reference signal. The calibration signal preferably comprises a sinusoidal signal having a predetermined maximum amplitude and a predetermined constant frequency. The disclosed comparing means is a phase-amplitude receiver.

Preferred embodiments of the invention further comprise means for determining a correction factor for the primary confined path signal transmitting device. In cases where the primary confined path signal transmitting device is an electrical cable utilized for transmitting test data or signals associated with a device under test in an antenna test range, the invention preferably includes means for applying the correction factor to the test data or signals to adjust for the mechanical and/or environmental influence upon the electrical cable.

The preferred means for determining the correction factor comprises a programmed computing means that is automatically operative to determine the correction factor during a calibration mode and is thereafter automatically operative in an operational mode for applying the correction factor to data transmitted via the primary confined path signal transmitting device, to obtain data adjusted for the mechanical and/or environmental influence. Where the device under test is a test antenna that is scanned by a probe antenna in an antenna test range, and the plurality of test data readings comprise data associated with a scan of the test antenna, the computing means is preferably operative for determining and applying a new correction factor for each of the plurality of test data readings.

Typically, but not necessarily, the primary confined path signal transmitting device and said other confined path signal transmitting devices are similar confined path signal transmitting devices, and the connecting means comprises means for connecting a one of the plurality of confined path signal transmitting devices to others of the plurality of confined path signal transmitting devices, to form connected pairs of the confined path signal transmitting devices. Switching means are provided for successively connecting a plurality of the connected pairs between a signal source and a measurement instrument, the signal source providing and applying a calibration signal to the connected pairs, and the connected pairs providing a resultant calibration signal to the measurement instrument.

The present invention is particularly useful in cases wherein a portion of each of the primary and the other confined path signal transmitting devices is remotely located relative to the measurement instrument, such as in an antenna test range connecting a probe antenna and a test antenna via electrical or other cables. In such cases, the connecting means may be remotely located, to effect the switching into pairs at the remote site. Accordingly, the preferred remotely located connecting means may be operative in response to control signals from a control means for automatically connecting the confined path signal transmitting devices to form the connected pairs.

Usually, but not necessarily, the confined path signal transmitting devices comprise similar but not necessarily identical confined path signal transmitting devices, such as similar electrical cables. However, it will be understood that the confined path signal transmitting devices can comprise signal transmitting optical fibers, optical transducers, rotary joints, semi-rigid coaxial cable, flexible coaxial cable, microwave components, or the like, or combinations thereof.

Still more particularly described, the present invention provides an automatic measurement system for determining a selected parameter of a primary electrical device, without a priori knowledge concerning the electrical characteristics of the primary electrical device, by solving a set of equations established by the measurement of a resultant calibration signal produced by the application of a calibration signal to each of a plurality of connected pairs of electrical devices, relative to a reference signal. The referenced signal is obtained from the same signal source as the calibration signal.

The plurality of electrical devices, including the primary electrical device, are connected by a connecting system to provide independent combinations of connected pairs of electrical devices. A switching system, which is automatically controlled by a controller, successively connects each of the connected pairs of electrical devices between a signal source and a measurement instrument. Upon connecting the signal source to a selected connected pair, the calibration signal is applied to the selected connected pair to provide the resultant calibration signal to the measurement instrument. The measurement instrument, which is also controlled by the controller, automatically measures the resultant calibration signal associated with each of the connected pairs of electrical devices and, furthermore, measures the reference signal.

The present invention then utilizes the controller to determine the selected electrical parameter of the primary electrical device by solving the set of equations generated by the measurement of each of the resultant calibration signals and the reference signal. By determining the selected electrical parameter of the primary electrical device for each of two separate time periods, the controller determines a correction factor used to reconcile data acquired via the primary electrical device at two or more successive intervals of time.

The present invention determines the selected electrical parameter, and consequently the correction factor, by measuring the measurement signal that passes along a one-way signal path, or transmission path, provided by a selected connected pair of electrical devices. In contrast to other known measurement techniques, the present invention does not require the measurement of a reflection signal that effectively travels along a single two-way signal path formed by the transmission path and the reflection path. In this manner, the present invention ensures a more accurate measurement of the measurement signal and, consequently, an accurate determination of the selected electrical parameter by eliminating the problems associated with the measurement of a reflection signal, including (i) measurement interference caused by multiple reflections of the reflection signal along the return path and (ii) a low signal to noise ratio caused by the increased attenuation of the reflection signal associated with the two-way signal path.

The present invention is useful for measurement applications associated with antenna measurement systems and network measurement systems. Specifically, an automatic measurement system constructed in accordance with the present invention will find particular utility in an antenna measurement system, such as a planar near-field measurement system, and can ensure the accuracy of the measurement of the characteristics of an antenna under test. As will be known to those skilled in the art, the characterization of the AUT requires the measurements of a microwave signal carried by a test signal cable connected between the moving probe antenna and stationary microwave instrumentation. However, the movement of the probe antenna causes the flexing of the test signal cable and induces cable variations. In addition, the changes of ambient temperature within the planar near-field measurement range also induce cable variations. By determining a parameter that represents the electrical characteristics of the test signal cable, specifically the insertion factor for the test signal cable, and, consequently, calculating the correction factor, the present invention permits the compensation of measurements conducted by the planar near-field measurement system to correct for variations in the test signal cable path induced by the motion of the probe antenna and ambient temperature changes.

Even more particularly described, the present invention provides automatic measurement systems and methods that perform successive measurements of a resultant calibration signal, provided by each of three independent combinations of connected pairs of electrical devices, specifically connected cable pairs, to determine the electrical length or, more generally, the insertion factor associated with each electrical cable. The three independent combinations of cable pairs include: (1) a primary cable and a first secondary cable, (2) the primary cable and a second secondary cable, and (3) the first secondary cable and the second secondary cable. Each of the three cables possesses an insertion factor representative of the cable's electrical characteristics.

By applying the calibration signal to each of the combinations of connected cable pairs, a resultant calibration signal associated with each of the combinations is produced for measurement by the automatic measurement system. In this manner, a set of three equations associated with the three combinations of connected pairs can be solved for the determination of the selected electrical parameter, specifically the insertion factor of the primary cable, wherein each equation is defined by a selected resultant calibration signal and the known reference signal.

The present invention utilizes a connecting means to connect the primary cable to the first secondary cable to form a first cable pair, to connect the primary cable to the second secondary cable to form a second cable pair, and to connect the first secondary cable to the second secondary cable to form a third cable pair. A switching system successively switches each of the first cable pair, the second cable pair, and the third cable pair between a measurement instrument and a signal source that provides the calibration signal and the reference signal. In this manner, each of the three unique combinations of pairs of cables is successively connected between the measurement instrument and the signal source to enable the measurement instrument to conduct a set of measurements.

A controller, preferably a computer, automatically directs the switching operations of the switching system and, furthermore, automatically directs the measurement instrument to measure each of the resultant calibration signals associated with the cable pairs. Also, the controller automatically directs the measurement instrument to measure the reference signal. A computer, either the controller or a separate computer system, operates upon the set of equations to determine the insertion factor for the primary cable.

By calculating the insertion factor for the primary cable during two separate time periods, the present invention then determines a correction factor to be applied to measurement data acquired via the primary cable to compensate for cable variations occurring during the interval between the two time periods. After solving for the insertion factor associated with each of the first period and the second period, the present invention calculates a correction factor defined by a ratio of the insertion factor for the first period to the insertion factor for the second period. The correction factor is then utilized to adjust measurement data acquired by use of the primary cable.

Therefore, it is an object of the present invention to provide apparatus and methods for correction of variations attributable to mechanical and/or environmental influences upon a cable utilized for acquisition of data.

It is another object of the present invention to provide apparatus and methods for correction of variations attributable to mechanical and/or environmental influences upon a cable utilized for acquisition of data in an automatic manner.

It is a further object of the present invention to determine the variation of a selected electrical characteristic of an electrical device without a priori knowledge concerning the selected electrical characteristic.

It is a further object of the present invention to automatically calculate a correction factor that is useful for the compensation of environmental influences upon a primary electrical device such as an electrical cable utilized for acquisition of data in an antenna test range.

It is a further object of the present invention to automatically determine the insertion factor for an electrical cable.

It is a further object of the present invention to automatically calculate a correction factor to compensate for cable variations induced by environmental influences, including movements, changes in ambient temperature, and other influences that affect the transfer characteristics of an electrical cable.

It is a further object of the present invention to provide a system for automatically determining and compensating for errors induced by deforming mechanical perturbations or influences such as bending, twisting, flexing, linear motion, or rotary motion, and by environmental perturbations or influences such as temperature, humidity, and fluid pressure variations, upon an electrical cable that connects a measurement instrument to a remotely located sensor.

It is a further object of the present invention to automatically calculate a correction factor to compensate for cable variation by conducting a one-way cable measurement in the transmission mode.

It is a further object of the present invention to improve the accuracy of the measurement of the phase and amplitude of a signal that is carried by an electrical cable subjected to motion, changes in ambient temperature, or other environmental influences.

These and other objects, features and advantages of the present invention will become apparent from consideration of the following detailed description of the disclosed embodiments and by reference to the accompanying drawings and claims.

DETAILED DESCRIPTION OF THE PREFERRED EMBODIMENTS

Figure 1:
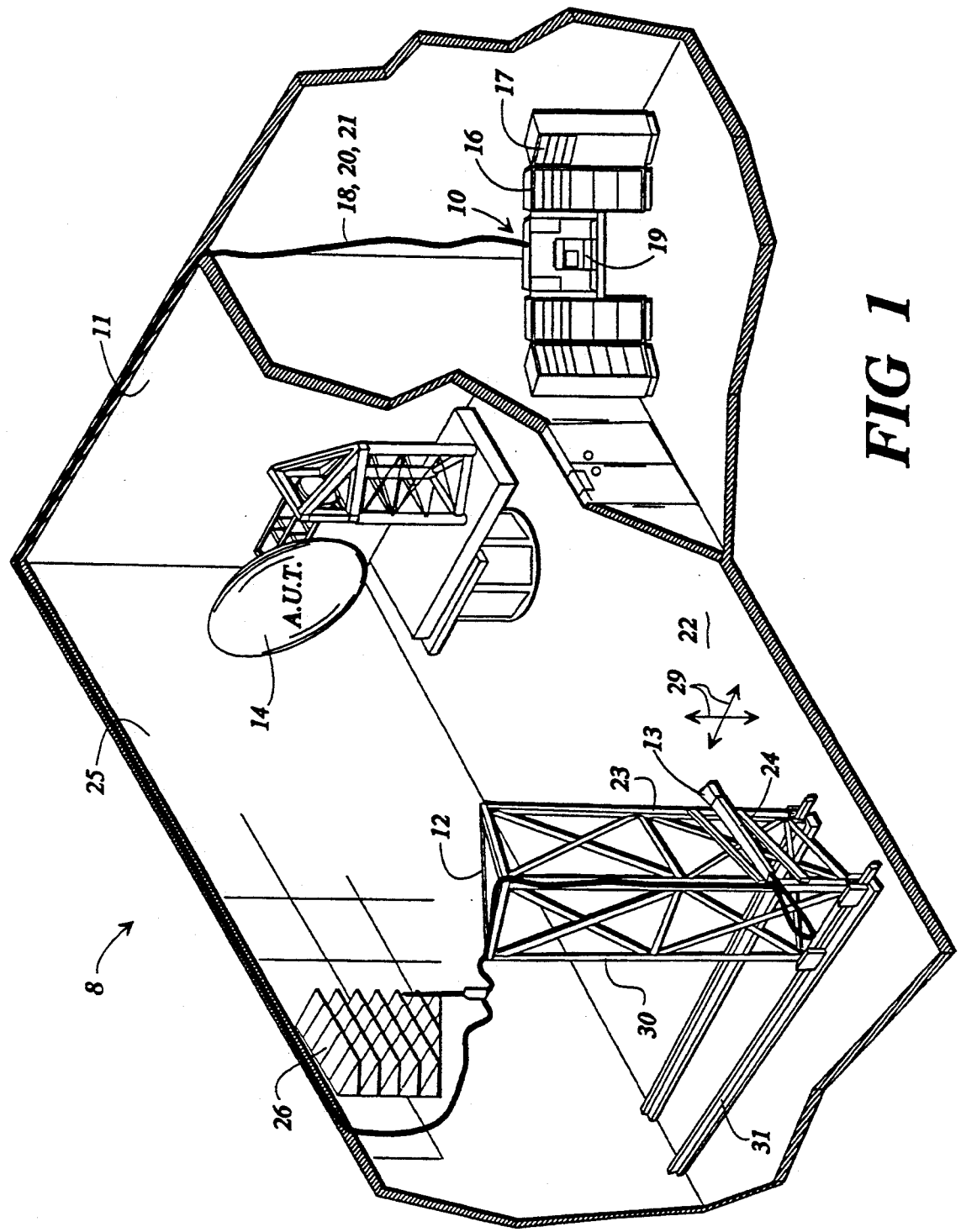
FIG. 1 illustrates an antenna test range, with an antenna under test (AUT), a probe antenna, and cables connecting to an antenna measurement system, forming a typical environment with which the present invention is particularly suited.

Referring now to the drawings, in which like numerals illustrate like elements throughout the several drawing figures, FIG. 1 illustrates an antenna test range 8 incorporating the preferred embodiment of a three-cable, automatic measurement system 10 implemented in accordance with the present invention. The preferred automatic measurement system 10 carries out the methods described herein for determining correction factors associated with a primary cable 18, by forming pairs of connected cables utilizing a primary cable 18, a first secondary cable 20, and a second secondary cable 21.

The preferred automatic measurement system 10 includes a signal source 15 (not shown), a measurement instrument 16, a controller 17, and a computing system 19. These components cooperate in the manner described below to conduct measurements utilizing the primary cable 18, first secondary cable 20, and second secondary cable 21, in a typical application such as in an antenna test range 8.

The present invention will be described with respect to transmission of a calibration signal via a connected pair of electrical cables to provide a resultant calibration signal, otherwise referred to as a measurement signal, for measurement by the measurement instrument 16. However, those skilled in the art will appreciate that the present invention also encompasses the more general concept of applying the calibration signal to a connected pair of electrical devices to provide the resultant signal for measurement by the measurement instrument to enable the determination of a selected characteristic of a selected electrical device.

The automatic measurement system 10 constructed in accordance with the present invention includes three independent electrical devices, such as electrical cables—the primary cable 18, the first secondary cable 20, and the second secondary cable 21. The cables 18, 20, and 21, preferably signal transmission systems such as coaxial cables, are all subjected to similar mechanical and/or environmental influences such as flexing, twisting, extending, straining, compressing, deforming, or otherwise altering the cable, or temperature, pressure, humidity, or other influences affecting the transfer characteristics of the cable.

The three electrical cables, when connected in the manner to be described, provide unique combinations of pairs of electrical cables. Each pair of cables forms a transmission system that is successively connected between the signal source 15 and the measurement instrument 16 to enable the measurement instrument 16 to conduct a measurement of the resultant signal produced by applying a calibration signal to each pair. The measurement operations, directed by a processor or computer to automate the measurement operations, such as the controller 17, establish a set of equations that lead to the determination of the variations in the transmission system and computation of appropriate correction factors to compensate for the mechanical and/or environmental influences.

Generally speaking, the automatic measurement system 10 determines the phase and amplitude variations in a transmission system to compensate measurements acquired from such a transmission system. As shown in FIG. 1, the illustrative antenna test range 8 is an indoor near-field measurement range 11, such as a planar near-field measurement range, and provides a typical environment for the operation of the preferred embodiment of the present invention. The near-field measurement range 11, located within an indoor facility, includes a mechanical scanner 12 for moving a probe antenna 13 during antenna measurements associated with the characterization of an antenna under test ("AUT") 14. The operation of the preferred embodiment within a planar near-field measurement system, such as the range 11, will be described in greater detail with respect to FIGS. 5 and 6A–6E.

For measurements of the characteristics of the AUT 14, the moving probe antenna 13 may be utilized to transmit signals for reception by the AUT 14 or, alternatively, the probe antenna 13 may be utilized to receive signals transmitted by the AUT 14. In either case, the moving probe antenna 13 is connected to stationary measurement instrumentation, such as the signal source 15 or the measurement instrument 16, by an electrical cable, such as the primary cable 18, which serves as a test signal cable for antenna measurements. For example, if the probe antenna 13 is utilized to transmit a signal to the AUT 14, the probe antenna 13 is connected to the signal source 15 via the primary cable 18. Alternatively, the probe antenna 13 is connected to the measurement instrument 16 when the probe antenna 13 is utilized to receive a signal transmitted by the AUT 14.

The mechanical scanner 12 moves the probe antenna 13 along an x-y plane, in the direction of arrows 29, to conduct a series of discrete measurements of the AUT 14. The signal source 15 provides a test signal for transmission by either the probe antenna 13 or the AUT 14 and, subsequently, reception by the non-transmitting antenna of the pair of antennas 13 and 14. The controller 17 controls the position of the mechanical scanner 12 and, consequently, of the probe antenna 13. Furthermore, the computer system 19 controls the measurement instrument 16, preferably a microwave signal measurement receiver, to perform measurements at predetermined measurement positions. In this manner, near-field measurements are automatically conducted within the range 11 to characterize the parameters of the AUT 14, including such antenna parameters as power gain and polarization.

Those persons skilled in the art will appreciate that the operating environment for the preferred embodiment is not limited to the use of the mechanical scanner 12 to move the probe antenna 13 in a scanning motion during measurements of the AUT 14. Indeed, the probe antenna 13 could also be supported by an alternative mounting configuration, including a box frame planar scanner, or a translation/rotation scanner with a horizontal scan plane. Either of the box frame planar scanner and the translation/rotation scanner could be utilized to move the probe antenna 13 along a series of scanning measurement positions.

The mechanical scanner 12 includes a vertical positioner tower 30 mounted along a horizontal track system 31. The horizontal track system 31 is mounted along a floor 22 of the range 11. The mechanical scanner 12 is free-standing and does not require a supporting wall or an auxiliary support structure. By moving the positioner tower 30 along the horizontal track 31, the system 10 conducts measurements of the AUT 14 along a horizontal axis defined by the layout of the horizontal track system 31 on the floor 22.

The positioner tower 30 includes a pair of vertical guide rails 23 that support and guide the probe antenna 13 for vertical movement. The vertical guide rails 23 support a probe antenna carriage 24 that mounts the probe antenna 13 for vertical movement. Vertical movement of the probe antenna 13 allows measurement of the characteristics of the AUT 14 along a vertical axis.

RF absorber tiles 26, shown along the wall 25, are also mounted along the positioner tower 30, the floor 22, and the ceiling (not shown) of the range 11 to minimize the effects of signal reflections upon the antenna measurements.

The combination of the vertical positioner tower 30 and the horizontal track system 31 enables the probe antenna 13 to continuously move along both a horizontal axis and a vertical axis to scan the AUT 14 during measurements within the near field range 11. Because the probe antenna 13 scans the AUT 14 during antenna measurement operations, the primary cable 18 follows the motion of the probe antenna 13 and such motion upon the primary cable 18 induces phase and amplitude changes for any signal travelling along the signal path provided by the primary cable 18. Furthermore, although the near-field measurement range 11 is typically housed within an indoor facility, the ambient temperature within such a facility varies as a function of the operation of the environmental control system associated with the facility and, accordingly, the ambient temperature influences the characteristics of the primary cable 18. Therefore, the use of an automatic measurement system 10 constructed in accordance with the present invention allows determination of cable variations induced by mechanical and/or environmental influences upon the primary cable 18 and, furthermore, determination of a correction factor to compensate the measurements acquired via the primary cable 18.

Those persons skilled in the art will recognize that the automatic measurement system 10 could also be utilized within a spherical near-field measurement range in which the probe antenna is generally mounted in a fixed position facing toward the AUT. The AUT is typically mounted on a turntable that rotates the AUT in both azimuth and elevation for scanning the stationary probe antenna. Accordingly, the test signal cable connected between the moveable AUT and fixed measurement instrumentation for a spherical near-field measurement range is subject to motion and other environmental influences that induce cable variations. For either the planar or spherical near-field measurement system, the test signal cable, such as the primary cable 18, is exposed to flexing that induces phase and amplitude errors for measurement data acquired via the test signal cable. Likewise, it will be understood that the automatic measurement system 10 is applicable to outdoor far-field measurement ranges, as well as indoor far-field measurement ranges.

Theory of the Three-Cable Method

Figure 2:
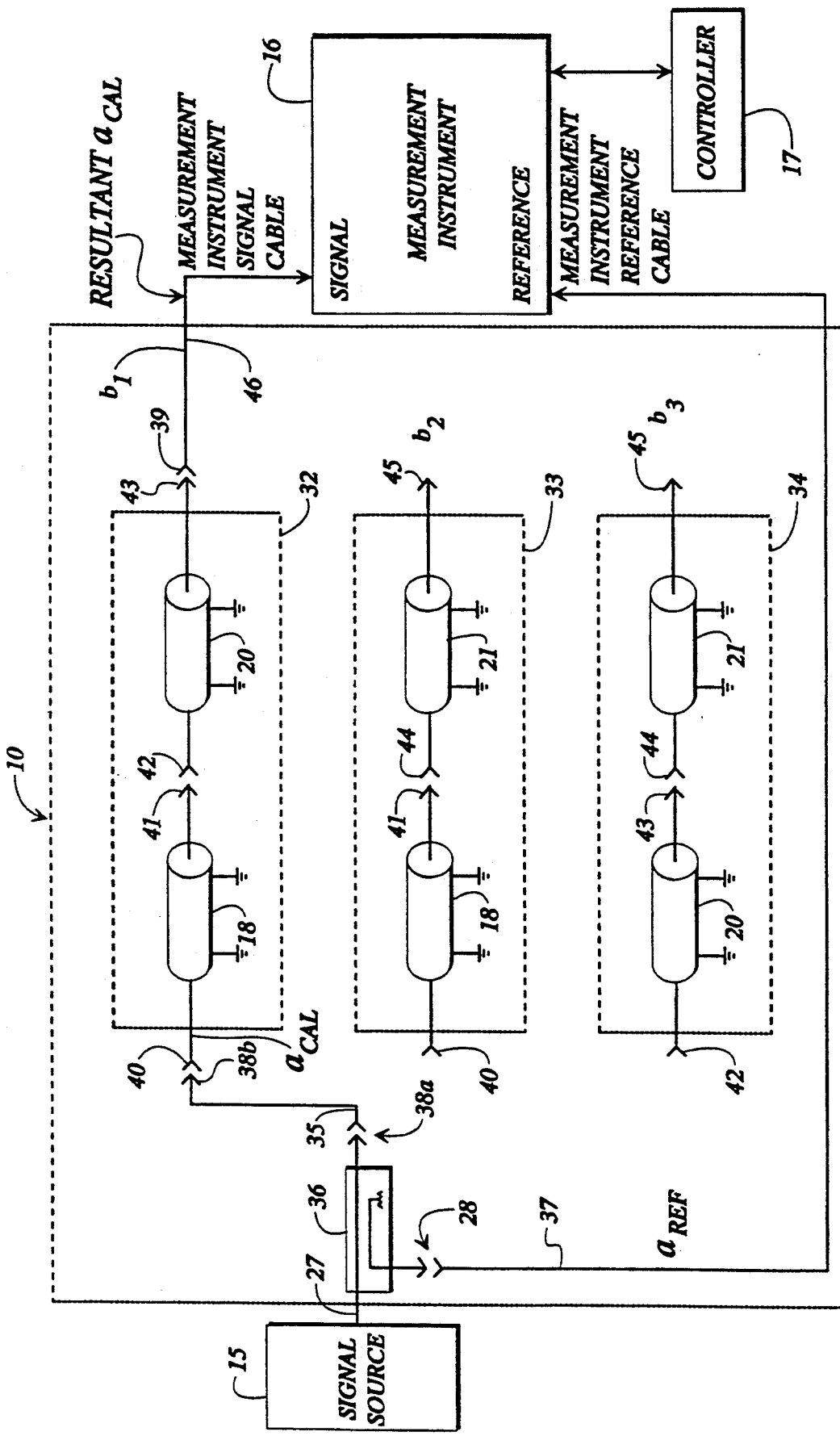
FIG. 2 is a block diagram of an embodiment of the present invention, illustrating the theory of operation.

Refer now to FIG. 2 for a discussion of the theory of the present invention and the conceptual formation of cable pairs in the three-cable method carried out in the present invention. In FIG. 2, each of the pairs of electrical cables are shown as combinations of the primary cable 18, first secondary cable 20, and second secondary cable 21, to form three cable pairs 32, 33, 34. Each cable pair is formed by electrically connecting any two of the three cables to provide a unique combination. Specifically, the primary cable 18 is electrically connected to the first secondary cable 20 to form a first cable pair 32. Likewise, the primary cable 18 is electrically connected to the second secondary cable 21 to provide a second cable pair 33. Also, the first secondary cable 20 is electrically connected to the second secondary cable 21 to provide a third cable pair 34.

The measurement of each of the cable pairs 32, 33, and 34 requires the application of an active stimulus to one end of the selected cable pair to generate a resultant signal or a measurement signal at the other end of the selected cable. Accordingly, the signal source 15 generates a signal at line 27 that ultimately serves as a calibration signal ($a_{CAL}$) applied to the cable pairs and a reference signal ($a_{REF}$) for a measurement instrument. The $a_{CAL}$ is applied to each of the cable pairs, in a successive manner, to provide the resultant calibration signal for measurement by the measurement instrument 16.

The signal on line 27 is applied to a source signal coupler 36 that couples the signal from the signal source 15 through a measurement instrument reference cable 37 to provide a phase reference signal ($a_{REF}$) for the REFERENCE channel input of the measurement instrument 16. The measurement instrument reference cable 37 in the preferred embodiment is typically a very short cable between the signal source 15 and measurement instrument 16, for example in adjacent or proximate racks such as shown in FIG. 1. It is therefore assumed that this cable 37 does not experience environmental influences, nor do its associated connectors such as 28 influence the $a_{REF}$ signal, to a degree that require compensation or adjustment. However, in this regard see the "Precalibration Mode" discussion below.

The coupled calibration signal provides a phase and amplitude reference for the measurements of the cable pairs conducted by the measurement instrument 16.

The coupler 36 directly outputs a signal from the signal source to a connector 38a, then to a calibration signal source cable 35, and then to a connector 38b that serves as a source port. The signal at the source port or output of the connector 38b comprises the $a_{CAL}$ calibration signal that is applied to each of the first cable pair 32, the second cable pair 33, and the third cable pair 34. The calibration signal $a_{CAL}$, after passing through the cable pair such as 32 in FIG. 2, becomes a resultant calibration signal, designated $b_1$ for the first cable pair 32, $b_2$ for the second cable pair 33, and $b_3$ for the third cable pair 33. The resultant calibration signal $b_1$ emerges from the first cable pair via a connector 39, which is connected to the SIGNAL input channel of the measurement instrument 16 via a measurement instrument signal cable 46. In like manner, the resultant calibration signals $b_2$, $b_3$ emerge from their respective cable pairs 33, 34 and are transmitted to the SIGNAL input channel of the measurement instrument 16 via the measurement instrument signal cable 46.

Again, it is assumed that the measurement instrument signal cable 46 does not experience environmental influences, nor do its associated connectors such as 39, influence the resultant calibration signals $b_1$, $b_2$, $b_3$ to a degree that require compensation or adjustment. In this connection, see the "Precalibration Mode" discussion below.

The cable pairs 32, 33, 34 are successively connected to the SIGNAL input of the measurement instrument 16 measurement via a port or connector 39 and measurement instrument signal cable 46, while the line 37 is coupled to the REFERENCE input of the measurement instrument. The controller 17 directs all measurements by and connections to the measurement instrument 16, in an automated manner as described in greater detail below, to automate the measurement operations.

By measuring the $a_{CAL}$ calibration signal originating at connector 38b after it passes through each of the cable pairs 32, 33, and 34 and, in addition, the reference cable 37, a set of equations, or transfer functions, can be established that define the electrical characteristics of the cable pairs. The set of transfer functions then can be solved to determine a selected electrical parameter for each of the cables, specifically an insertion factor related to the electrical length for a cable. Because the transfer characteristics of a cable carrying microwave frequency signals change in response to mechanical and/or environmental influences upon the cable, and, consequently, the insertion factor associated with the cable varies, a measurement of a signal passing through a cable subject to such environmental influences requires correction to ensure the accuracy of the measurement. In general, antenna measurement systems and network measurement systems require highly accurate measurements of signals carried by a transmission system such as an electrical cable.

A first transfer function (1) is established for a cable combination as follows:

$$\frac{b_1}{a_{CAL}} = F_0 F_1 \qquad \text{(Equation 1)}$$

where
$a_{CAL}$ = calibration signal provided by cable 35 at the source port 38b.
$F_0$ = insertion factor of the primary cable 18
$F_1$ = insertion factor of the first secondary cable 21
$b_1$ = resultant calibration signal or measured output voltage associated with the first cable pair 32

It will be appreciated that the measurement of the resultant calibration signal $b_1$ is made with the measurement instrument 16.

Equation 1, which characterizes the transfer function for the first cable pair 32, also can be applied to the remaining combinations of cable pairs. The application of Equation 1 to each of the remaining cable pairs 33 and 34 is preferably simplified by assuming that the reference signal is a fixed frequency signal having a constant amplitude level.

Accordingly, a second transfer function for the second cable pair 33 is established as follows:

$$\frac{b_2}{a_{CAL}} = F_0 F_2 \qquad \text{(Equation 2)}$$

where
$F_2$ = insertion factor of the second secondary cable 21
$b_2$ = resultant calibration signal or measured output voltage associated with the second cable pair 33.

Likewise, a third transfer function (Equation 3) for the third cable pair 34 is established for the cable combination as follows:

$$\frac{b_3}{a_{CAL}} = F_1 F_2 \quad \text{(Equation 3)}$$

where $b_3$ = resultant calibration signal or measured output voltage associated with the third cable pair 34.

For this set of transfer functions represented by the Equations 1, 2, and 3, each measured cable pair output voltage or resultant calibration signal $b_1$, $b_2$, $b_3$ represents a measured parameter associated with each of the cable pairs 32, 33, and 34, as determined by the measurement instrument 16, in successive fashion. The calibration signal $a_{CAL}$ applied on line 35 preferably is maintained at a predetermined maximum voltage level and a fixed frequency to simplify the measurement operations.

Once the set of the measured output voltages or resultant calibration signals $b_1$, $b_2$, $b_3$ associated with each of the cable pairs 32, 33, and 34 is known, the three unknown insertion factors $F_0$, $F_1$, and $F_2$ can be determined as a function of the calibration signal applied to each of the cable pairs by solving the transfer functions defined by the Equations 1, 2, and 3. The solutions to the set of transfer functions are:

$$F_0 = +/- \sqrt{b_1 b_2 / b_3 a_{CAL}} \quad \text{(Equation 4)}$$

$$F_1 = +/- \sqrt{b_2 b_3 / b_1 a_{CAL}} \quad \text{(Equation 5)}$$

$$F_2 = +/- \sqrt{b_1 b_3 / b_2 a_{CAL}} \quad \text{(Equation 6)}$$

The set of transfer functions and their solutions demonstrate that the insertion factors $F_0$, $F_1$, and $F_2$ for each of the three electrical cables, the primary cable 18, the first secondary cable 20, and the second secondary cable 21, can be obtained from the measurements of three unique combinations of pairs of cables. In particular, it will be appreciated that the insertion factor for each of the cables can be determined without a priori knowledge concerning the insertion factor for each of the cables. The solutions for the set of transfer functions provide a pair of acceptable solutions for each insertion factor. Specifically, the elements of a pair of solutions differ by a factor of 180 degrees of phase, as suggested by the use of the plus (+) sign and the minus (−) sign.

In preferred embodiments of the present invention, the controller 17, which preferably includes a computer system such as a microprocessor, is utilized to solve the set of transfer functions to determine the insertion factor associated with each of the cables 18, 20, and 22. However, those skilled in the art will recognize that a separate computing system that operates independently of the controller 17 could also be utilized to determine the insertion factor associated with each cable. In either case, it is preferable to utilize a computer system to automate the process of solving the set of transfer functions.

Still in reference to FIG. 2, each of the primary cable 18, the first secondary cable 20, and the second secondary cable 21 include an input port and an output port to facilitate the connection of a selected cable to another cable to form the cable pairs. The primary cable 18 includes a primary cable input port 40 and a primary cable output port 41. Similarly, the first secondary cable 20 includes a first secondary cable input port 42 and a first secondary cable output port 43. Also, the second secondary cable 31 includes a second secondary cable input port 44 and a second secondary cable output port 45.

Thus, the first cable pair 32 is formed by connecting the primary cable output port 41 to the first secondary cable input port 42. Similarly, the second cable pair 33 is formed by connecting the primary cable output port 41 to the second secondary cable input port 44. Finally, the third cable pair 34 is formed by connecting the first secondary cable output port 43 to the second secondary cable input port 44.

The present invention does not require a specific order or arrangement of any two cables within a selected cable pair. For example, a first cable pair could also be formed by connecting the first secondary cable output port 43 to the primary cable input port 40 to connect the first secondary cable 20 to the primary cable 18. Likewise, a second cable pair could also be provided by connecting the second secondary cable output port 45 to the primary cable input port 40. In addition, a third cable pair could be formed by connecting the second secondary cable output port 45 to the first secondary cable input port 42.

It will be understood that the present invention is not limited to the use of an electrical cable such as coaxial cable. The electrical cable could be any signal transmission system, including optical fiber cable and waveguide. Indeed, the present invention contemplates the use of any electrical device having at least one input port and at least one output port to define a transmission path for carrying a signal between the input port and the output port.

In order to compensate for errors in measurement data imparted to signals transmitted by use of a cable such as the primary cable 18, it is necessary to obtain and apply "correction factors" to the measurement data transmitted by the cable. In order to obtain correction factors, the preferred automatic measurement system 10 determines the insertion factor associated with the primary cable 18 during two separate points in time, a first period and a second period, and uses these time-separated insertion factors to obtain a correction factor. In other words, an original value of the insertion factor for the primary cable 18 is determined during the first period and, at a later time, an updated value of the insertion factor associated with the primary cable 18 is determined during the second period.

The "correction factor" CF is defined by a ratio of the insertion factor for the first period ($t_1$) to the insertion factor for the second period ($t_2$). Thus, by applying the calculated correction factor to measurement data transmitted via the primary cable 18 between the first period and the second period, the measurement data is adjusted or compensated for any cable variations occurring during the interval between the first period and the second period. The correction factor CF may be defined as:

$$CF = \frac{F_0(t_1)}{F_0(t_2)} \quad \text{(Equation 7)}$$

Both the insertion factor associated with the primary cable 18 during the first period, $F_0(t_1)$, and the insertion factor associated with the primary cable 18 during the second period, $F_0(t_2)$ are determined as a function of the calibration signal $a_{CAL}$ applied via the source port 38$b$ to the cable pairs 32, 33, and 34. If one assumes that the calibration signal maintains stable frequency and amplitude characteristics during the time interval defined by the first period and the second period, then $a_{CAL}$ included within the numerator of Equation 7, insertion factor $F_0(t_1)$, cancels $a_{CAL}$ included within the denominator of Equation 7, insertion factor $F_0(t_2)$. Consequently, it will be understood that it is not necessary to know or measure $a_{CAL}$ to determine the correction factor for correcting cable variations associated with the primary cable 18. In contrast, it is necessary to measure the resultant calibration signals or output voltages $b_1$, $b_2$, $b_3$ to quantitatively determine the insertion factor for the primary cable 18.

Although the preferred three-cable measurement system 10 is capable of calculating an insertion factor for each of the three cables, the primary cable 18, the first secondary cable 20, and the second secondary cable 21 as a function of the calibration signal, only the insertion factor associated with the primary cable 18, which is determined at each of two different time periods, is required to determine the correction factor CF that corrects test signal measurements associated with the use of the primary cable 18.

Precalibration Mode

It should be understood at this juncture that passage of the signals through connectors 38a, 38b and calibration signal source cable 35 will not affect the relationship between the applied calibration signal $a_{CAL}$ and the reference signal $a_{REF}$ on line 37. Ideally, the applied calibration signal $a_{CAL}$ and the reference signal $a_{REF}$ will not be identical, but will remain in fixed ratio. Accordingly, preferred embodiments of the present invention will measure this ratio of $a_{CAL}$ and $a_{REF}$ with a precalibration operation.

In a precalibration operation, the following steps are taken. Connect the measurement instrument reference cable 37 to the output of the coupler. Connect the measurement instrument signal cable 46 to the connector 38b. Record the reading of the measurement instrument's signal and reference channels.

With the foregoing in mind, the calibration signal ($a_{CAL}$) may now be defined as the complex voltage or phasor reading of a signal applied to the SIGNAL channel of a measurement instrument 16 during a precalibration mode, described below, and as the value of the output signal from the calibration signal source cable 35 (appearing at the connector 38b). Likewise, the reference signal ($a_{REF}$) may now be defined as the complex voltage or phasor reading of the reference channel of the measurement instrument in the precalibration mode.

Assuming that the coupler 36, the calibration signal source cable 35, the measurement instrument reference cable 37, and the measurement instrument signal cable 46 do not change, a "precalibration factor" $F_{PRE}$ is defined as:

$$F_{PRE} = \frac{a_{CAL}}{a_{REF}} \quad \text{(Equation 8)}$$

The precalibration factor $F_{PRE}$ can be used to relate the value of the calibration signal $a_{CAL}$ to the reading of the measurement instrument's reference channel. Therefore, at any instant of time, one can always infer that the calibration signal is given by:

$$a_{CAL} = F_{PRE} a_{REF} \quad \text{(Equation 9)}$$

Switching Networks for Forming Cable Pairs

Figure 3:
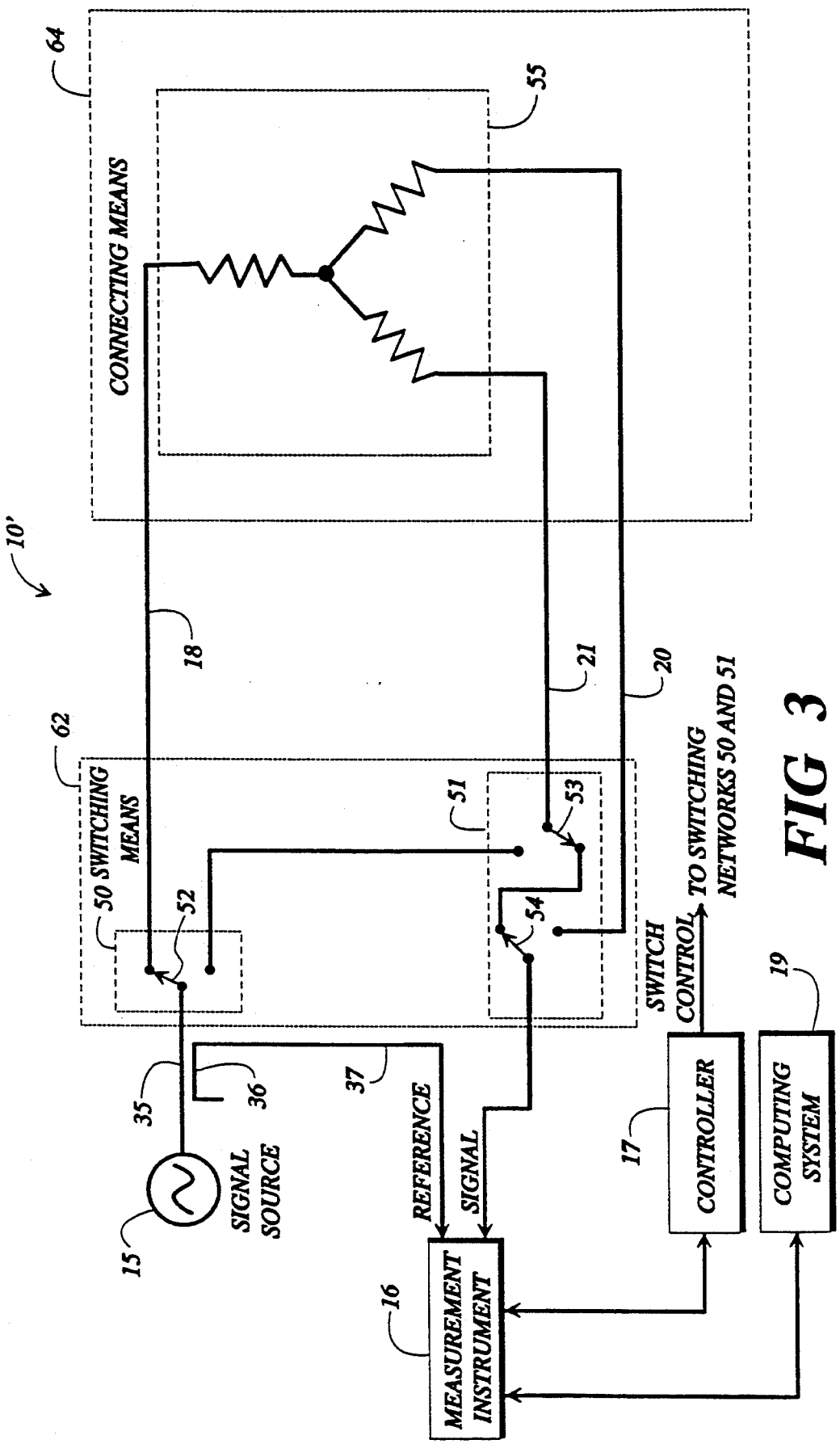
FIG. 3 is a block diagram of an alternative embodiment of the present invention.

FIG. 3 is a block diagram for another embodiment 10' of an automatic measurement system constructed in accordance with the present invention. In particular, FIG. 3 shows an embodiment that includes a switching system comprising a switching means 62 and a connecting means 64. In this embodiment 10', the switching means 62 comprises switching networks 50, 51, and the connecting means 64 comprises a power divider 55 for implementing the electrical connections, in an automatic and successive manner, of the primary cable 18, first secondary cable 20, and second secondary cable 21 to form cable pairs 32, 33, and 34 between the signal source 15 and the measurement instrument 16.

To determine the insertion factor and, accordingly, the correction factor for the primary cable 18, the signal source 15 applies the calibration signal on line 35, in a successive manner, to each of the cable pairs for measurement by the measurement instrument 16. The measurement instrument 16 conducts measurements of each of the three cable pairs and the reference cable 37 to provide the three transfer functions of Equations 1, 2, and 3 above. Those skilled in the art will appreciate that the application of the transfer functions provided by Equations 1, 2, and 3 to the embodiment 10' assumes that each of the switching networks 50 and 51 and the power divider 55 maintain perfect isolation between each of the cables 18, 20, and 21. In other words, the actual implementation of the embodiment 10' of the automatic measurement system is characterized by transfer functions having a form similar to the Equations 1, 2, and 3, but further including additional factors associated with the characteristics of the switching networks 50 and 51 and the power divider 55. Determination of such appropriate additional factors is considered within the capabilities of the skilled artisan.

A computing system 19 processes the measurements associated with each of the cable pairs 32, 33, and 34 relative to the reference cable 37 to determine the insertion factor for the primary cable 18. These determinations and calculations are performed at two different times, to obtain two different insertion factors for the primary cable 18, to obtain the correction factor of Equation 7.

The switching means 62, which includes the first switching network 50 located at the output of the signal source 15 and the second switching network 51 positioned at the SIGNAL input to the measurement instrument 16, is utilized to automate the successive connection of each cable pair between the signal source 15 and the measurement instrument 16. Each of the switching networks 50 and 51 is controlled by the controller 17 with SWITCH CONTROL signals to automatically direct the switching operations for each of the measurements. The SWITCH CONTROL signals operate to actuate switches within the switching networks 50, 51.

The first switching network 50 includes a first switch 52, also described as a signal source switch, directs the calibration signal provided on line 35 to either the input of the primary cable 18 during the measurements of the first cable pair 32 and the second cable pair 33, or to the second switching network 51 during the measurement of the third cable pair 34.

The second switching network 51 includes a second switch 53 and a third switch 54. The second switch 53, further described as a measurement instrument switch, connects the second secondary cable 21 to the first switching network 50 for passing the calibration signal on line 35 to the second secondary cable 21 via the first switch 52, during the measurement of the third cable pair 34. Alternatively, the second switch 53 connects the second secondary cable 21 to the third switch 54 during the measurement of the second cable pair 33.

The third switch 54, also referred to as a power divider switch, in the second switching network 51 connects the SIGNAL input of the measurement instrument 16 to the first secondary cable 20 during the measurement of the first cable pair 32. Alternatively, the third switch connects the SIGNAL input the second secondary cable via a terminal of the second switch 53 during the measurement of the second cable pair 33.

Consequently, the first switch 52 controls the selection of signal paths for the output of the signal source 15, while the third switch 54 controls the selection of inputs for the SIGNAL input of the measurement instrument 16. Similarly, the second switch 53 controls signal access to or from the second secondary cable 21. Each of the switches 52, 53, and 54 is preferably a microwave switch having single pole, double throw (SPDT) contacts, that is responsive to a SWITCH CONTROL signal from a control device, such as the controller 17, for the selection of switch positions.

The primary cable 18, first secondary cable 20, and second secondary cable 21 in FIG. 3 are connected at their distal ends via a power divider 55. It should be understood that the power divider 55 could be augmented with additional switching networks (as explained in connection with FIGS. 5 and 6A-6E), to allow use of the primary cable for conducting signals from a device under test, such as the AUT 14 in FIG. 1.

Those persons skilled in the art will appreciate that the foregoing discloses one embodiment of a switching system for the measurement system 10'. The first cable pair 32 is connected between the signal source 15 and the measurement instrument 16 by (1) operating the first switch 52 to provide a signal path between the signal source 15 and the primary cable 18 and (2) operating the third switch 54 to provide a signal path between the measurement instrument 16 and the first secondary cable 20.

In addition, the second cable pair 33 is connected between the signal source 15 and the measurement instrument 16 by (1) operating the first switch 52 to provide a signal path between the signal source 15 and the primary cable 18, (2) operating the second switch 53 to provide a signal path between the second secondary cable 21 and the third switch 54, and (3) operating the third switch 54 to provide a signal path between the measurement instrument 16 and the second switch 53. Furthermore, the third cable pair 34 is connected between the signal source 15 and the measurement instrument 16 by (1) operating the first switch 52 to provide a signal path between the signal source 15 and the second switch 53, (2) operating the second switch 53 to provide a signal path between the first switch 52 and the second secondary cable 21, and (3) operating the third switch 54 to provide a signal path between the measurement instrument 16 and the first secondary cable 20.

During the measurement of the first cable pair 32, the signal source 15 applies the calibration signal on line 35 via the first switch 52 to the input of the primary cable 18. The output of the primary cable 18 is electrically connected to the input of the first secondary cable 20 by the power divider 55 to form the first cable pair 32. The output of the first secondary cable 20, which also defines the output of the first cable pair 32, is provided to the SIGNAL input of the measurement instrument via a signal path defined by the switch positions of the second switch 53 and the third switch 54. The controller 17 controls the switching operations of the first switch 52, the second switch 53, and the third switch 54 to provide the signal paths required to pass the signal on line 35 through the first cable pair 32 to the measurement instrument 16.

In addition, the controller 17 directs the measurement instrument 16 to automatically measure the output of the first cable pair 32, a first output signal, to complete a first cable pair measurement, otherwise described as a "first calibration measurement". In this manner, the resultant calibration signal $b_1$ is obtained.

After the measurement instrument 16 measures the output of the first cable pair 32, the controller 17 directs the switching operations of the first switch 52, the second switch 53, and the third switch 54 to enable the calibration signal on line 35 to pass through the second cable pair 33 for measurement by the measurement instrument 16. In particular, the calibration signal is applied to the input of the primary cable 18 via the first switch 52. The output of the primary cable 18 is electrically connected to the second secondary cable 21 by the power divider 55. The output of the second secondary cable 21, which also defines the output of the second cable pair 33, a second output signal, is provided to the measurement instrument 16 via the second switch 53 and the third switch 54. Similar to the first cable pair measurement, the controller 17 directs the measurement instrument 16 to automatically measure the output of the second cable pair 33 to complete the second cable pair measurement, which may be referred to as a "second calibration measurement". In this manner, the resultant calibration signal $b_2$ is obtained.

Likewise, the controller 17 directs the switching operations of the first switch 52, the second switch 53, and the third switch 54 to enable the signal from the signal source 15 to pass through the third cable pair 34 for measurement by the measurement instrument 16. For the third cable pair measurement, the signal on line 35 is applied to the second secondary cable 21 via the signal path provided by the first switch 52 and the second switch 53. The output of the second secondary cable 21 is electrically connected to the input of the first secondary cable 20 by the power divider 55. The output of the first secondary cable 20, which also defines the output of the third cable pair 34, is provided to the measurement instrument 16 via the signal path provided by the third switch 54. The controller 17 directs the measurement instrument 16 to measure the output of the third cable pair 34, a third output signal, to complete the third cable pair measurement, which may be referred to a "third calibration measurement". In this manner, the resultant calibration signal $b_3$ is obtained.

In FIG. 3, as in FIG. 2, the signal from the signal source 15 is coupled to the REFERENCE input of the measurement instrument 16 by connecting the source signal coupler 36 to a measurement instrument reference cable 37, and then to the REFERENCE input. In the foregoing manner, the measurement instrument 16 completes a set of three calibration measurements associated with the cable pairs, relative to the reference signal to the REFERENCE input of the measurement instrument.

The computing system 19 receives each of the three calibration measurements or resultant calibration signals $b_1$, $b_2$, $b_3$. By operating upon the resultant calibration signals $b_1$, $b_2$, $b_3$ and making use of the precalibration factor $F_{PRE}$ discussed above, the computing system 19 determines the insertion factor for the primary cable 18 associated with a first period. Alteratively, by repeating this set of measurements during a second time period, the computing system 19 obtains sufficient calibration measurement data to complete the calculation of the correction factor CF for the primary cable 18 by operating on $b_1$, $b_2$, $b_3$ without needing $F_{PRE}$. In this manner, the computing system 19 can apply the correction factor CF to measurement data acquired via the primary cable 18 to compensate for any cable variations occurring during the interval during the first time period and the second time period.

The computing system 19 preferably includes a memory storage device, such as random access memory (RAM), to store the resultant calibration signals $b_1$, $b_2$, $b_3$ during each of the first time period and the second time period to provide a stored first output signal, a stored second output signal, and a stored third output signal associated with each of the first time period and the second time period. By storing the calibration measurements or resultant calibration signals $b_1$, $b_2$, $b_3$, the computing system 19 can calculate the correction factor CF for the primary cable 18 at a time subsequent to the calibration measurement operations.

Each of the controller 17 and the computing system 19 is a computing device that typically includes a microprocessor. Those skilled in the art will recognize that the functions of the controller 17 and the computing system 19 can be conducted by a single computing device, such as a personal computer of the type exemplified by the IBM series of personal computers or their compatibles. Moreover, the preferred controller 17 and/or computing system 19 includes a memory means, such as RAM, disk storage, or the like, for storing measured electrical parameters or characteristics associated with a given cable pair, for subsequent determination of selected electrical parameters such as correction factors for the primary cable 18.

Those skilled in the art will understand that the switching means 62 and connecting means 64 shown in FIG. 3 may comprise elements for carrying out the functions of switching and connecting the three cables 18, 20, 21, other than those illustrated in the figure and described above. For example, a coupling network comprising three directional couplers, each associated with one of the three cables, may be employed as the connecting means 64. In such an embodiment, the cables and couplers would be arranged so that each cable includes a directional coupler positioned at the remote end of the cables, each coupler coupling the signal from an adjacent one of the three cables into the associated cable.

In such an embodiment using a coupling network, the switching means 62 will be arranged so that the switches associated with the switching means provide the calibration signal as an excitation for one of the three cables 18, 20, 21, and connects the coupled signal received from the adjacent cable to the measurement instrument 16 for receiving the resultant calibration signal. Yet other arrangements and embodiments for carrying out the functions of the switching means 62 and the connecting means 64 may occur to those skilled in the art.

Figure 4:
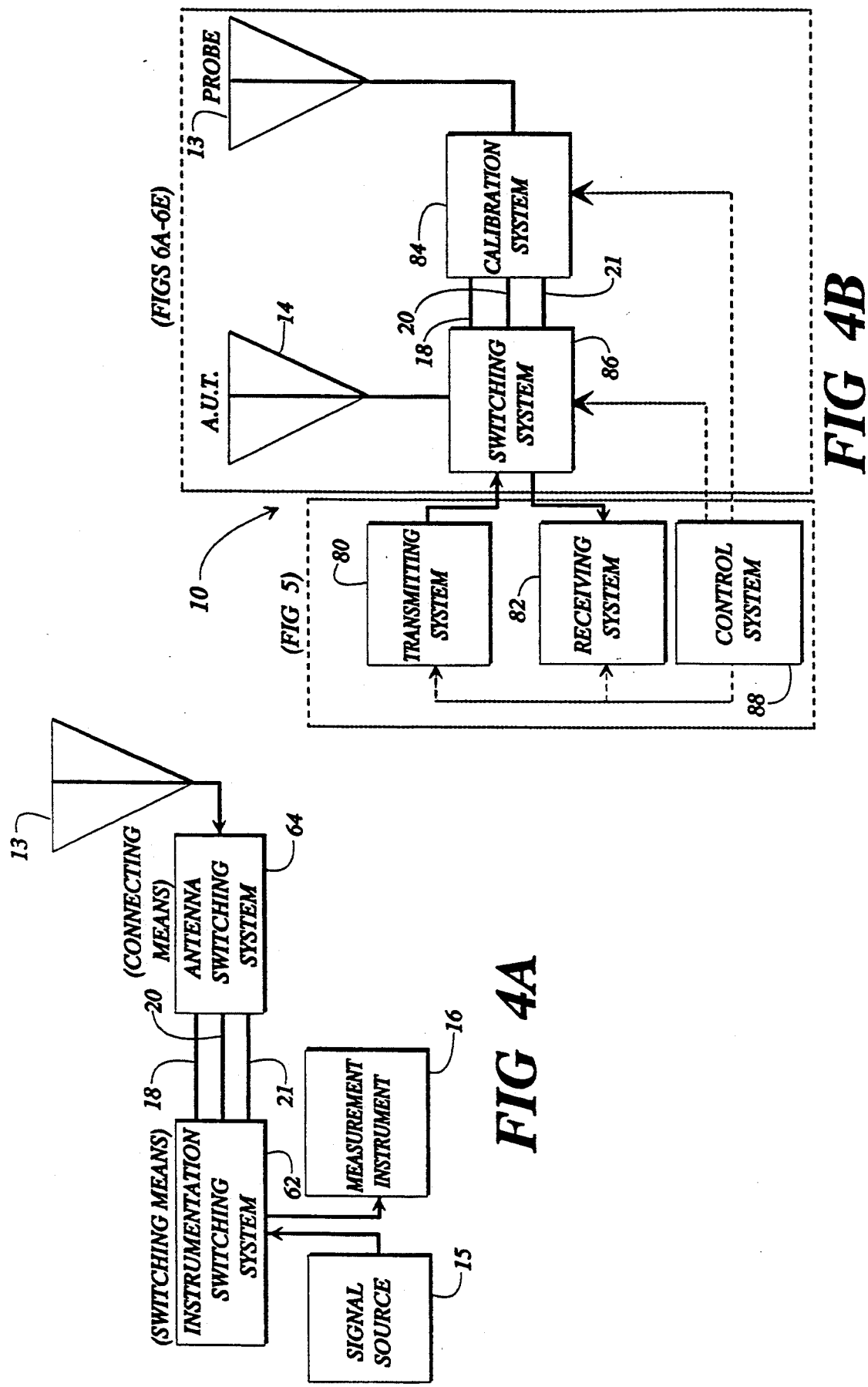
FIG. 4A-4B are block diagrams for various embodiments of the present invention.

As shown in FIGS. 4A–4B, switching networks can be implemented to automate the process of connecting the cables associated with the cable pairs 32, 33, and 34. As generally shown in FIG. 4A, for the preferred embodiment as exemplified in FIG. 1 and FIGS. 5 and 6A–6E at 10, a switching network comprises a connecting means 64 for connecting the cables at a distal or remote end of the cables 18, 20, 21, typically at or near the probe antenna 13, and a switching means 62 for connecting the cables at a proximal or near end of the cables 18, 20, 21, typically at or near the signal source 15 and measurement instrument 16.

Furthermore, the switching network could also be utilized to connect the primary cable 18 as a test signal cable between a moving antenna associated with a near-field measurement range, such as the probe antenna 13, and either the signal source 15 or the measurement instrument 16. Likewise, the switching network could be utilized to connect the primary cable 18 as a test signal cable between the AUT 14 (not shown in FIG. 4A) and either the signal source 15 or the measurement instrument 16.

The embodiment of FIG. 4A is generally useful in applications involving cables or other similar elongate signal transmitting devices to consider the present invention as comprising a set of two switching networks, an instrumentation switching system or switching means 62, and an antenna switching system or connecting means 64, operate to connect the appropriate cables to form each of the cable pairs 32, 33, and 34 and, furthermore, to connect a selected cable between the instrumentation associated with either a calibration measurement or an antenna measurement. The instrumentation switching system 62 is connected to a proximal end of each of the cables 18, 20, and 21, and comprises a switching means for successively connecting a plurality of the connected pairs between a signal source and a measurement instrument. Thus, the instrumentation switching system 62 is connected to the signal source 15 and the measurement instrument 16. In this manner, the instrument switching system 62 operates to connect either the signal source 15 or the measurement instrument 16 to a proximal end of a selected cable.

An antenna switching system 64 is connected to a distal or remotely located end of each of the cables 18, 20, and 21 and operates to connect any two of the distal ends to form a selected cable pair. The antenna switching system 64 therefore comprises means for connecting one of a plurality of confined path signal transmitting devices such as cables to a second one of the plurality of confined path signal transmitting devices to form a connected pair of confined path signal transmitting devices. Furthermore, the antenna switching system 64 is connected to the moving antenna, such as the probe antenna 13 (or the AUT 14) within a planar near-field measurement range.

For example, during the first calibration measurement, the instrument switching system 62 operates to connect the proximal end of the primary cable 18 to the signal source 15 and, furthermore, connects the proximal end of the first secondary cable 20 to the measurement instrument 16. In synchronism with the operation of the instrumentation switching system 62, the antenna switching system 64 operates to connect the distal end of the primary cable 18 to the distal end of the first secondary cable 20 to form the first cable pair 32. In this manner, the signal source 15 applies a calibration signal to the first cable pair 32 and the measurement instrument 16 measures the resultant signal produced by the application of the calibration signal to the first cable pair.

During an antenna measurement, the instrument switching system 62 operates to connect either the signal source 15 or the measurement instrument 16 to the proximal end of the primary cable 18. In synchronism with the operation of the instrumentation switching system 62, the antenna switching system 64 connects the moving antenna, such as the probe antenna 13, to the distal end of the primary cable 18. In this manner, a test signal is carried by the primary cable 18 between the moving antenna and the selected instrumentation, either the signal source 15 or the measurement instrument 16. Consequently, at least two separate switching networks can be utilized to implement an embodiment of the automatic measurement system 10.

Those persons skilled in the art will recognize that various switching networks may be constructed for implementing the switching operations of the present invention. Those skilled in the art will understand that switching networks that include at least one switching system could be utilized to automate the connection operations conducted by the automatic measurement system 10. Furthermore, those skilled in the art will appreciate that the switching networks can be automatically controlled via a controlling system, such as the controller 16, to automate the selection of signal paths provided by the switching systems.

Preferred Automatic Measurement System

Referring now to FIGS. 4B, 5 and 6A–6E, the preferred automatic measurement system 10 comprises the application of the present invention for a near-field measurement system, such as the planar near-field measurement range 11 depicted in FIG. 1. The preferred measurement system 10 includes a transmitting system 80, a receiving system 82, a calibration system 84, a switching system 86, and a control system 88. The measurement system 10 operates in either (1) an antenna measurement mode or (2) a calibration measurement mode for the near-field measurement system environment. The system also operates in a precalibration mode, as discussed above, for determining the precalibration factor $F_{PRE}$.

During the antenna measurement mode, the measurement system 10 measures the selected characteristics of the AUT 14 by operating the transmitting system 80 to generate a test signal for transmission by either the probe antenna 13 or the AUT 14. This transmission of the test signal is received by the non-selected antenna and passed via the primary cable 18 to the receiving system 82 for measurement and processing. The switching system 86 operates to provide the signal path necessary to route the output of the transmitting system 80 to either the probe antenna 13 or the AUT 14 and, in addition, operates to provide the necessary signal path to direct the output of the non-selected antenna to the receiving system 82. The control system 88, either directly or indirectly, as described in more detail below, controls the switching operations of the switching system 86. In addition, the control system 88 controls the operations of the transmitting system 80 and the receiving system 82. In this manner, an automated measurement system is provided for the measurement of the characteristics of the AUT 14.

During the calibration measurement mode, the transmitting system 80 generates a calibration signal ($a_{CAL}$) that provides the baseline input signal for calibration measurements conducted by the receiving system 82. The switching system 86 operates to provide the signal path necessary to route the output of the transmitting system 80 (the calibration signal $a_{CAL}$) to the calibration system 84 to initiate the calibration operations. In turn, the calibration system 84 directs the calibration signal $a_{CAL}$ through one of the cable pairs, the first cable pair 32, the second cable pair 33, or the third cable pair 34, otherwise referred to, respectively, as a first measurement cable, a second measurement cable, and a third measurement cable and the output of the selected cable pair is provided to the receiving system 82 via the switching system 86.

The receiving system 82 measures the resultant calibration signals $b_n$ (where $n=1, 2, 3$) passed by the selected cable pair to provide a calibration measurement for the selected cable pair. The calibration operation is repeated until a calibration measurement is conducted for each of the cable pairs 32, 33, and 34. Similar to the antenna measurement mode, the control system 88 directs the signal generating operations of the transmitting system 80, the receiving operations of the receiving system 82, and the switching operations of the switching system 86 to provide automated calibration measurements.

Transmitting System

The transmitting system 80 includes the signal source 15 that generates the signals on line 35 utilized as a test signal for exciting either the probe antenna 13 or the AUT 14 during the antenna measurement mode. Furthermore, the signal source 15 generates the test signal on line 35 for use as the calibration signal $a_{CAL}$ for exciting the calibration system 84 during the calibration measurement mode.

The test signal on line 35 is preferably a fixed frequency microwave signal having a predetermined maximum amplitude level. A highly stable, fixed frequency signal is preferable for providing a baseline test signal for repeatable antenna measurements and a baseline calibration signal for repeatable calibration measurements.

The signal source 15 is preferably a Scientific Atlanta Model 2180 signal source that provides standard frequency coverage of 2 to 20 GigaHertz (GHz). The signal source 15 can also include a frequency synthesizer (not shown), such as the Scientific Atlanta Model 2186 frequency synthesizer, to insure high accuracy frequency tuning and signal stability for frequencies in the microwave frequency range.

A source amplifier 90, connected to the output of the signal source 15, amplifies the test signal to insure an adequate signal level for the test signal on line 35 prior to providing the signal as a baseline input to either the probe antenna 13 or the AUT 14 during the antenna measurement mode or the calibration system 84 during the calibration mode. The source amplifier 90 is preferably a power amplifier, such as the Model AMP-3B-5254-50-26P-TC marketed by Miteq. A source isolator 92 accepts the amplified output of the source amplifier 90 to isolate the transmitting system 80, specifically the signal source 15, from extraneous signal reflections generated downstream of the signal source.

To insure the generation of a constant amplitude level for the test signal on line 35 by the signal source 15, a coupler 94 accepts the output of the source isolator 92 and provides a coupled reference signal via a feedback signal path to an amplitude levelling signal input of the signal source 15. The feedback signal path includes a detector 98, preferably a diode detector such a Hewlett-Packard 8474C, to rectify the microwave frequency signal and thereby provide a voltage signal associated with the amplitude of the test signal on line 35.

A signal levelling circuit included within the preferred Scientific Atlanta 2180 signal source 15 monitors the voltage signal and adjusts the amplitude of the output so as to provide a predetermined maximum amplitude microwave signal. An attenuator 96, connected between the coupler 94 and the detector 98, effectively limits the power level associated with the signal provided via the coupler to the detector. In addition, the attenuator 96 provides a specific impedance level that is necessary to optimize the detection performance of the diode detector 98.

Receiving System

The preferred receiving system 82 includes the measurement instrument 16 for the measurement of the test signal received by either the probe antenna 13 or the AUT 14 during the antenna measurement mode. Furthermore, the measurement instrument 16 is utilized to measure the output of the calibration system 84 during the calibration mode.

The measurement instrument 16 is preferably a phase-amplitude receiver having multi-measurement channels. In particular, the measurement instrument 16 is preferably a Scientific Atlanta microwave receiver, Model 1795, having up to four measurement channels and one reference channel. The Scientific Atlanta Model 1795 operates between the microwave frequency range of 2 to 20 GHz. Furthermore, the preferred Scientific Atlanta Model 1795 can utilize an optional remote local oscillator (not illustrated) for each of the measurement channels and the reference channel to provide for improved sensitivity and dynamic range when the microwave receiver is utilized in a near-field measurement range environment. The remote local oscillator may be placed as close to the moving antenna, such as the probe antenna 13, as is practicable to reduce signal loss of the test signal because of cable attenuation.

The receiving system 82 receives the output of the switching system 84 for measurement during the antenna measurement mode or the calibration measurement mode. In particular, the output of the switching system 86 is provided to a receiver isolator 100 to prevent reflection signals generated within the receiving system 82 from interfering with the operation of the calibration system 84 or the operation of the switching system 86 and, consequently, the performance of the probe antenna 13 and the AUT 14. The output of the receiver isolator 100 is amplified by a receiver amplifier 102 to produce an adequate signal level for inputs of the measurement instrument 16. The receiver amplifier 102 is preferably an amplifier having a low noise figure to minimize the effects of noise upon any measurement conducted by the measurement instrument 16.

The output of the receiver amplifier 102 is filtered by a filter 104 to remove harmonic signals produced by the receiver mixer 106 or intermodulation signals produced by the amplifying operation of the receiver amplifier 102. For the preferred embodiment, the receiver filter 104 is a band-pass filter. The filtered output is down-converted by a receiver mixer 106 to generate an intermediate frequency (IF) signal for demodulation and processing by the measurement instrument 16. The intermediate frequency signal is provided to one of the measurement or SIGNAL channel inputs of the measurement instrument 16.

The receiver mixer 106, which is preferably positioned within close proximity of the moving probe antenna 13, down-converts the microwave frequency of the measurement signal provided as the output of the switching system 86 to the lower frequency range of the intermediate frequency signal. It should be understood that the cable carrying the measurement signal attenuates the measurement signal as a function of signal frequency and cable length. In general, cable attenuation increases in proportion to an increase of the frequency of the signal carried by the cable. Therefore, the receiver mixer 106 effectively minimizes the attenuation of the measurement signal as a function of cable attenuation by down-converting the measurement signal to a lower frequency range prior to passing the measurement signal to the measurement instrumentation, specifically the measurement instrument 16. In this manner, the use of the receiver mixer 106 improves the signal-to-noise ratio of the measurement signal.

The output of the source isolator 92 is also coupled by the reference channel coupler 36 to provide the reference signal $a_{REF}$ for the REFERENCE input of the measurement instrument 16. The reference signal, which represents the phase and amplitude characteristics of the signal generated by the signal source 15, is passed to the reference channel of the measurement instrument 16 via a signal path that includes an attenuator 108 and a source mixer 110. The measurement of the phase characteristics of the coupled signal is necessary to insure accurate phase and amplitude measurements of any signal provided to the measurement channels associated with the measurement instrument 16.

Similar to the receiver mixer 106, the source mixer 110 is inserted between the output of the attenuator 108 and the REFERENCE input of the measurement instrument 16 to down-convert the phase reference signal to a lower or intermediate frequency range for processing by the measurement instrument 16. In this manner, cable attenuation of the reference signal is minimized by the placement of the source mixer 110 near the signal source 15. The attenuator 108 provides a proper decrease in the power level of the coupled signal provided by the reference channel coupler 36 to the source mixer 110 to insure proper conversion operation by the source mixer 110.

Calibration System

Because the probe antenna 13 is preferably a dual-polarized antenna having both vertical and horizontal polarizations, the calibration system 84 operates to connect either a vertical polarization port or a horizontal polarization port of the probe antenna 13 to the switching system 86 via the primary cable 18 during the antenna measurement mode. Importantly, the calibration system 84 operates to electrically connect any pair of the cables formed by the primary cable 18, the first secondary cable 20, and the second secondary cable 21 to form the first cable pair 32, the second cable pair 33, or the third cable pair 34 during the calibration mode. The primary cable 18, the first secondary cable 20, and the second secondary cable 21 extend between the calibration system 84 and the switching system 86.

Still referring to FIGS. 5 and 6A-6E, the calibration system 84 includes a calibration switch 112, a calibration isolator 114, and a power divider 55. During the antenna measurement mode, the calibration switch 112 provides a signal path between a selected one of the vertical polarization (VP) port and the horizontal polarization (HP) port of the probe antenna 13 to the primary cable 18. In this manner, the probe antenna 13 is connected via the switching system 86 to either the output of the transmitting system 80 when the probe antenna is utilized as a transmit antenna or to the input of the receiving system 82 when the probe antenna is used as a receive antenna.

The calibration switch 112 also provides a signal path between the selected calibration port (CAL) and the primary cable 18, and thereby connects the primary cable 18 to the power divider 55, via the calibration isolator 114, during the calibration mode. The calibration isolator 114 prevents signal reflections generated by the switching system 86 from entering the calibration switch 112 and the probe antenna 13. In particular, the calibration isolator 114 prevents signal reflections from interfering with the transmission or reception by the probe antenna 13 during the antenna measurement mode. The isolated output of the calibration isolator 114 is provided to the power divider 55 for dividing the isolated output into two separate signal paths.

The power divider 55 is a preferably a three-port device having a first port 118, a second port 120, and a third port 122. The power divider is preferably a Model 1515 marketed by Weinschel. The output of the calibration isolator 114 is connected to the first port 118. Likewise, the first secondary cable 20 is connected to the second port 120. Also, the second secondary cable 21 is connected to the third port 122. In this manner, the power divider 55 electrically connects the primary cable 18 to the first secondary cable 20 to form the first cable pair 32, connects the primary cable 18 to the second secondary cable 21 to form the second cable pair 33, and connects the first secondary cable 20 to the second secondary cable 21 to form the third cable pair 34.

Switching System

The switching system 86 operates to provide the required signal paths for connecting the transmitting system 80 to either the probe antenna 13 or to the AUT 14, and the receiving system 82 to the above nonselected antenna during the antenna measurement mode. In addition, the switching system 86 operates to provide the required signal paths to connect the calibration system 84 between the transmitting system 80 and the receiving system 82 for each of the cable pair measurements during the calibration measurement mode.

The switching system 86 includes a source switch 130, an AUT switch 132, a measurement switch 134, a primary cable switch 136, and a second secondary cable switch 138. The source switch 130 directs the output of the transmitting system 80 to either the AUT 14, via the AUT switch 132, or to the calibration system 84, via either the primary cable switch 136 or the second secondary cable switch 138. The source switch 130 is preferably a single pole, four throw (SP4T) solid state switch manufactured by Alpha as Model MT7534-70. The AUT switch 132 is preferably an electromechanical switch or relay that is used only to reverse the measurement range by allowing the AUT 14 to operate in either the transmit mode or the receive mode. In particular, the AUT switch 132 is a single pole, double throw (SPDT), coaxial switch marketed by Hewlett-Packard as Model HP3314B.

The measurement switch 134 connects the input of the receiving system 82 to one of the outputs of the calibration system 84 during the calibration mode. The measurement switch 134 is preferably a SPAT solid state switch or relay manufactured by Alpha as Model MT7534-70.

The primary cable switch 136 is utilized to connect the primary cable 18 to either the output of the transmitting system 80, via the source switch 130, or the input of the receiving system 82 via the measurement switch 134. The primary cable switch 136 is preferably a SPDT solid state switch manufactured by Alpha as Model MT7534-69.

The second secondary switch 138 provides a signal path between the second secondary cable 21 and either the output of the transmitting system 80 or the input to the receiving system 82. The second secondary cable switch 138 is preferably a solid state, SPDT switch manufactured by Alpha as Model MT7534-69.

Control System

Still referring to FIGS. 5 and 6A–6E, the control system 88 is operative to direct the measurement operations of the measurement instrument 16, to control the signal generating operations of the signal source 15, and to manage the switching operations of the calibration system 84 and the switching system 86. The control system 88 is preferably located in an area shielded from the electromagnetic environment of the near-field measurement range 11. For the near-field measurement system environment, the control system 88 is typically installed in a console room 140, which is separated from the electromagnetic signal environment of the near-field measurement range.

The control system 88 is preferably a Scientific-Atlanta Model 2095 that includes a controller 17 for automating the measurement operations of the measurement instrument 16 during the antenna measurement mode and the calibration measurement mode. The controller 17 is preferably compatible with the preferred Scientific Atlanta Model 1795 measurement receiver and is remotely located in the console room 140 for shielding. Details of the manner of controlling the preferred Scientific Atlanta Model 1795 measurement receiver are available in the literature supplied by the manufacturer. For the use of the preferred Scientific Atlanta Model 1795 measurement receiver, the controller 17 provides a control signal to each remote local oscillator (not illustrated) of the measurement instrument 16 and, furthermore, accepts the output of each of the local oscillators for processing of the down-converted measurement signals. The control signal provided by the controller is typically passed via either an IEEE-488 bus or an RS-232/449 serial interface.

The control system 88 also includes a source control unit 150 to automate the signal generating operations of the signal source 15. Similar to the controller 17, the source control unit 150 is preferably a computing system that includes a microprocessor. Accordingly, the source control unit 150 is preferably remotely located in the console room 140 for shielding from electromagnetic interference from the near-field measurement range. For the preferred Scientific Atlanta 2180 signal source, the source controller 150 communicates with the signal source 15 via an RS-232/449 compatible full-duplex serial link with a selectable data rate of up to 19.2 Kb/seconds maximum.

The control system 88 preferably includes a switch controller 154, coupled to the measurement instrument 16 and the controller 17, to direct the switching operations for each of the switches included within the calibration system 84 and the switching system 86 via signal lines 162 and 160. An interface 152 associated with the switch controller 154 accepts a control signal from each of the measurement instrument 16 and the controller 17 and, in accordance with these control signals, applies a control signal to the switch controller 154 to automate the selection of signal paths provided by the calibration system 84 and the switching system 86 during both antenna measurement operations and calibration measurement operations. For the preferred embodiment, the controller 17 instructs the measurement instrument 16 to conduct a calibration measurement and, in response, the measurement instrument 16 provides a control signal via the interface 152 that enables the control operations of the switch controller 154. Consequently, the control signals provided by the controller 17 to the interface 152 include a reset signal to reset the interface operations. Nevertheless, it will also be understood that the controller 17 could also be programmed to direct the switching operations of the calibration system 84 and the switching system 86 without utilizing the measurement instrument 16 to enable such control operations.

Computing System

The computing system 19 receives and processes each of the measurements conducted by the measurement instrument 16. In particular, the computing system 19 receives antenna measurement data associated with measurements of the characteristics of the AUT 14 during the antenna measurement mode. Furthermore, the computing system 19 receives calibration measurement data or resultant calibration signals, otherwise described as the first calibration measurement, the second calibration measurement, and the third calibration measurement, associated with each of the cable pairs 32, 33, and 34 during the calibration mode. The computing system 19 is typically located in the console room 140 to shield the computing system from the electromagnetic signal interference from the near-field measurement range. The computing system 19 is preferably a digital computer such as the type exemplified by the IBM series of personal computers or their compatibles.

During the calibration mode, the computing system 19 operates upon the calibration measurement data associated with each of the cable pairs 32, 33, 34 to determine the insertion factor for the primary cable 18. For calibration measurements conducted during two separate time periods, a first time period and a second time period, the computing system 19 operates upon the calibration measurement data to determine the insertion factor for the primary cable during the first time period and the second time period.

The computing system 19 also computes the ratio of the insertion factor associated with the first time period $F_0(t_1)$ to the insertion factor associated with the second time period $F_0(t_2)$ to determine the correction factor CF for the primary cable 18.

After calculating the correction factor CF, the computing system 19 applies the correction factor to antenna measurement data acquired via the primary cable 18 and thereby compensates or adjusts the antenna measurement data for cable variations occurring during the time interval between the first time period and the second time period. In this manner, the computing system 19 insures a more accurate characterization of the parameters for the AUT 14.

Although not required for the determination of the correction factor for the primary cable 18, the computing system 19 also could be programmed to determine the insertion factor for the first secondary cable 20 and the second secondary cable 21 by operating upon the calibration measurements associated with each of the cable pairs 32, 33, and 34.

Cabling System

It should be understood that the "primary cable" 18 need not constitute a single, unitary cable. Rather, combinations of electrical components that form a signal path from one point to a second point may be collectively considered as a "primary cable", and the present invention is still useful for determining correction factors associated with such combinations or collections of elements where such combinations or collections are subjected to varying environmental influences.

In this regard, consider that in the exemplary near field test range 11 shown in FIG. 1, the primary cable 18, the first secondary cable 20, and the second secondary cable 22 are supported by a set of articulating arms (not shown). The set of articulating arms, preferably includes a pair of vertical articulating arms for supporting the cables during movement of the probe antenna 13 along the x-axis and a pair of horizontal articulating arms for supporting the cables during movement of the probe antenna 13 along the y-axis. Because the primary cable 18 flexes as a function of the movement of the probe antenna 13, the primary cable 18 preferably comprises the combination of a microwave rotary joint mounted at each joint of the set of articulating arms, fixed sections of semi-rigid coaxial cable mounted along each articulated arm, and a small section of flexible coaxial cable positioned near each rotary joint to relieve any stress on the rotary joint and to allow the articulated arms to flex.

Moreover, it may be expected that as optical fiber technologies continue to improve, optical fibers may find increasing use in transmitting signals in antenna measurement and similar applications. Optical fibers, as confined path signal transmitting devices, are considered within the scope of the present invention, taken alone or in combination with other signal transmitting devices.

Those skilled in the art will thus recognize that the combination of the rotary joints, semi-rigid coaxial cable, and flexible coaxial cable are collectively considered a "primary cable" 18, and such components are just one implementation of an electrical cable suitable for use in the near-field measurement range environment. Moreover, it will be understood that the primary cable 18 (as well as the first secondary cable 20 and the second secondary cable 21) could be implemented as either a single cable or a combination of elements, including flexible coaxial cable, optical fiber cable, semi-rigid coaxial cable, and rotary joints.

As shown in FIG. 1, an alternative example of a primary cable 18 is the use of flexible coaxial cable that is mounted along the structure of the vertical positioner tower 30 in such a manner as to provide sufficient flexibility to accommodate the motion of the probe antenna 13. In particular, an excess length of cable is utilized to ensure such flexibility, as indicated by the loop of cable shown in FIG. 1. Nevertheless, an example of the primary cable 18 provides a suitable implementation for other electrical cables associated with the operation of the measurement system 10 within the range 11, including the first secondary cable 20 and the second secondary cable 21. Indeed, for the preferred embodiment, each of the first secondary cable 20 and the second secondary cable 21 is implemented by the combination of the rotary joints, semi-rigid cable, and flexible coaxial cable. It will therefore be understood that use of the present invention is not limited to the above-described exemplary implementation for the primary cable 18, the first secondary cable 20, and the second secondary cable 21.

Antenna Measurement Mode

Figure 5:
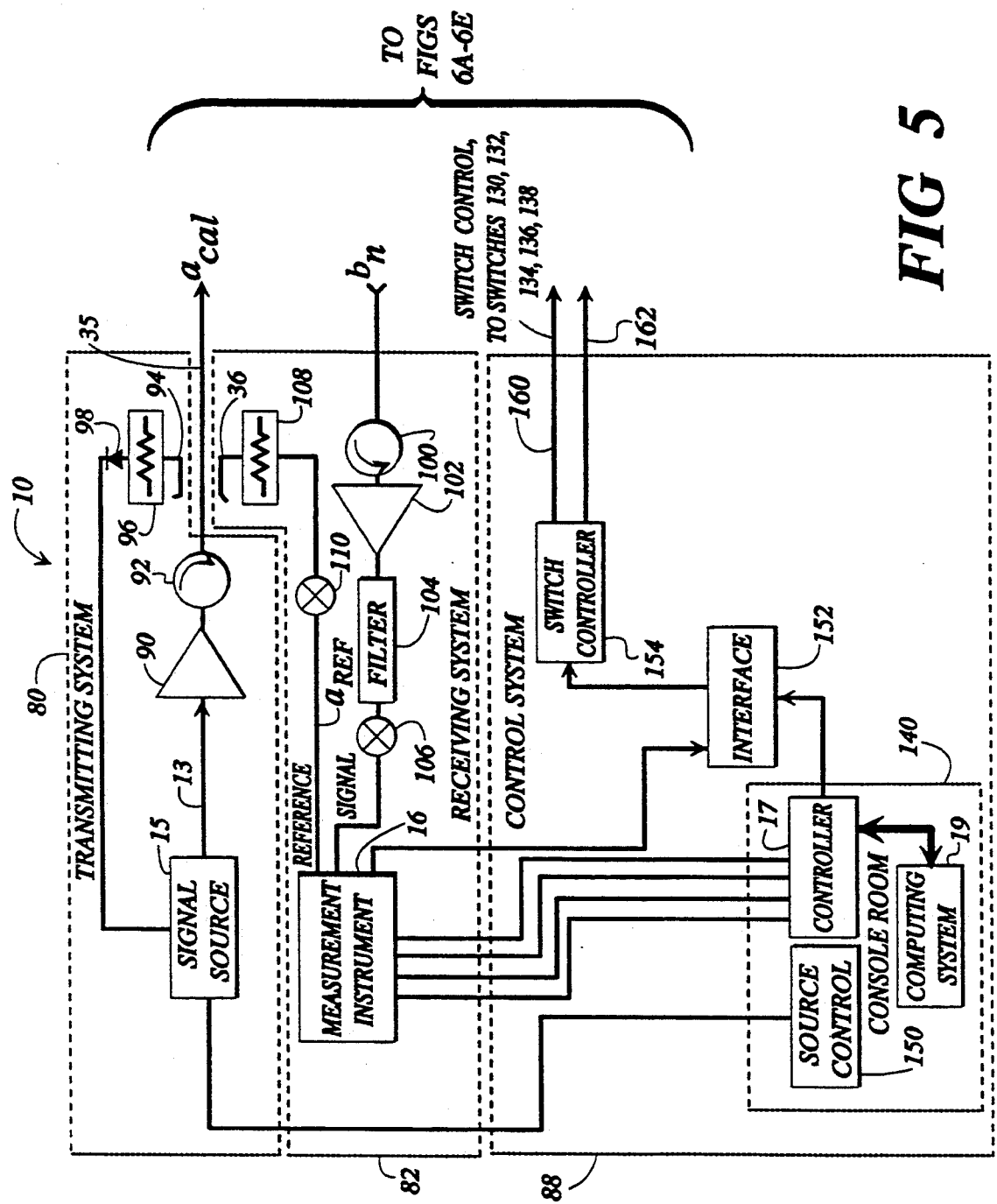
FIG. 5 is a block diagram of the transmitting system, receiving system, and control system for the preferred embodiment of the present invention.
Figure 6A:
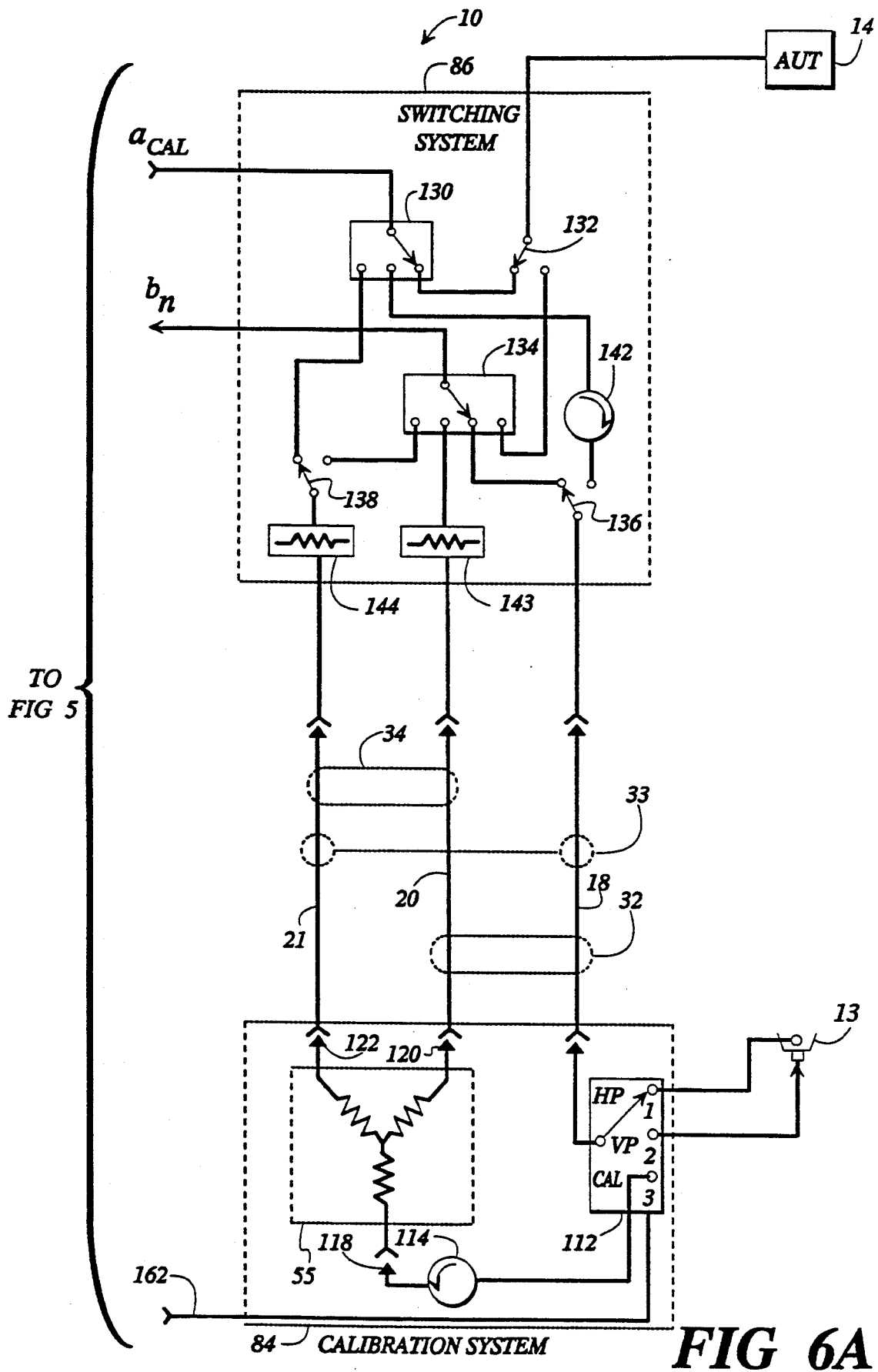
FIG. 6A is a block diagram of the calibration system and switching system for the preferred embodiment of the present invention, configured for conducting a first antenna measurement.
Figure 6B:
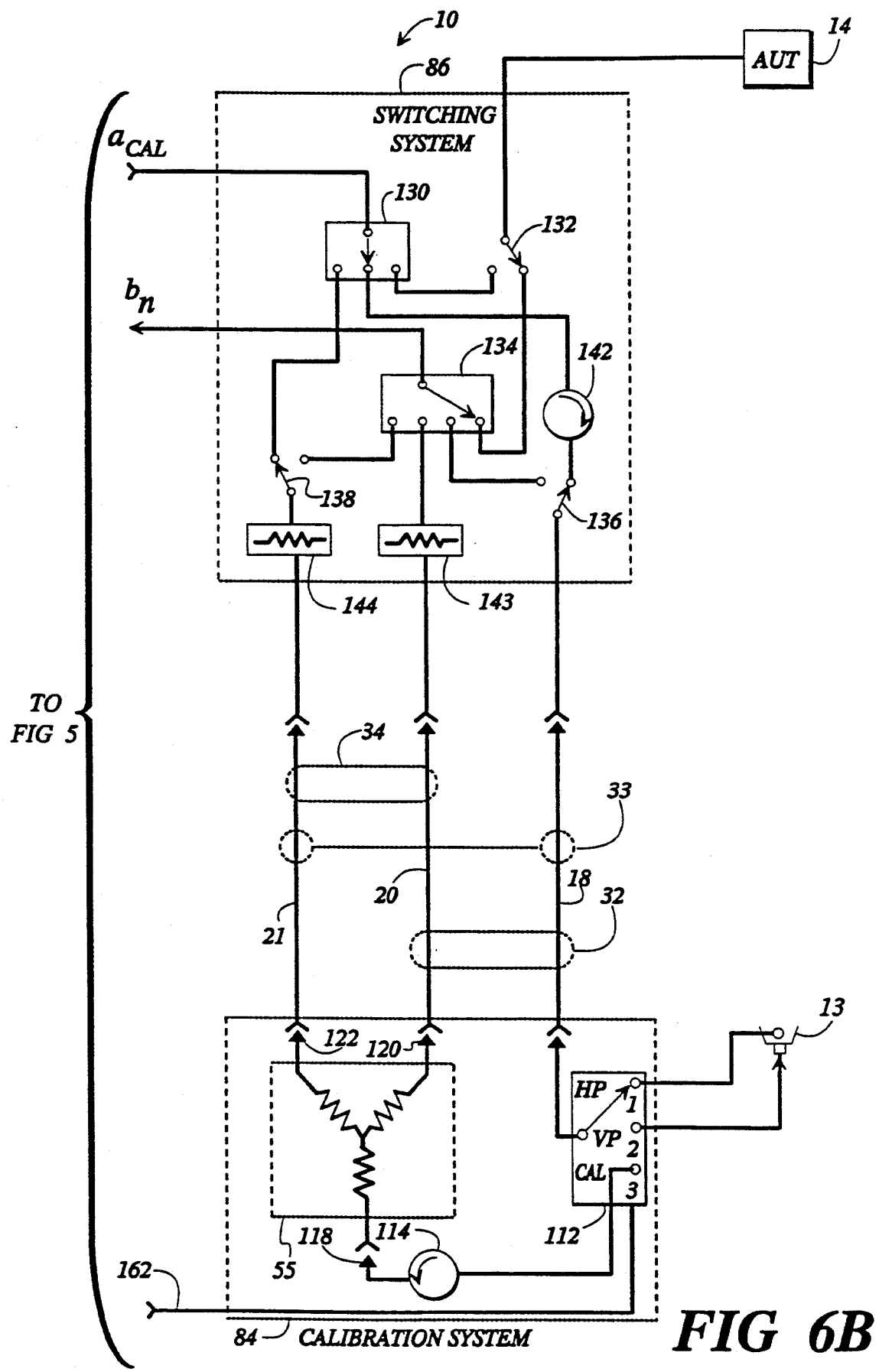
FIG. 6B is a block diagram of the calibration system and the switching system for the preferred embodiment of the present invention, configured for conducting a second antenna measurement.

As described above, the AUT 14 is utilized as either a transmit antenna or a receive antenna during the antenna measurement mode of operation in the preferred embodiment. FIGS. 5 and 6A illustrate the switch positions of the calibration system 84 and the switching system 86 when the AUT 14 is utilized as a transmit antenna and the probe antenna 13 is utilized as a receive antenna. Likewise, FIGS. 5 and 6B show the switch positions for the calibration system 84 and the switching system 86 when the AUT 14 is utilized as a receive antenna and the probe antenna 13 is utilized as a transmit antenna.

Referring again to FIGS. 5 and 6A, for the case when the AUT 14 operates in the transmit mode, the output of the transmitting system 80 is passed via the switching system 86 for transmission by the AUT 14. Specifically, the combination of the source switch 130 and the AUT switch 132 provides a signal path to connect the output of the transmitting system 80, the amplified form of the test signal on line 35, to the input of the AUT 14. The AUT 14 transmits the amplified test signal to generate a test signal for reception by the probe antenna 13.

The probe antenna 13 passes the received test signal via the calibration switch 112 to the primary cable 18. The primary cable 18 provides a signal path between the calibration system 84 and the switching system 86. The switching system 86 accepts the output of the primary cable 18 and passes the received test signal via a signal path provided by the combination of the measurement switch 134 and the primary cable switch 136 to the receiving system 82.

The receiver isolator 100 accepts the output of the switching system 86 for measurement by the receiving system 82. In this manner, the test signal transmitted by the AUT 14, and, in turn, received by the probe antenna 13, is passed via the calibration system 84, the primary cable 18, and the switching system 86 to the receiving system 82 for measurement by the measurement instrument 16.

Referring now to FIGS. 5 and 6B, which depict the operation of the AUT 14 in the receive mode, the source switch 130 accepts the output of the transmitting system 80 and passes the output signal via an isolator 142 and the primary cable switch 136 to the primary cable 18. The isolator 142 prevents reflection signals generated by the calibration network 84 from reaching the transmitting system 80 or the receiving system 82. Specifically, the isolator 142 prevents such reflection signals from being coupled by either the reference coupler 30 or the coupler 94 to, respectively, the measurement instrument 16 or the signal source 15. The isolator 142 is preferably manufactured by Narda as Model 4914.

The primary cable 18 carries the output of the switching system 86 to the calibration switch 112 for transmission of the test signal by the probe antenna 13. The probe antenna 13 transmits a test signal that is subsequently received by the AUT 14.

The AUT 14 provides the received test signal via the signal path formed by the combination of the AUT switch 132 and the measurement switch 134 to the receiver isolator 100 to enable the measurement of the received test signal by the receiving system 82. In this manner, the test signal transmitted by the probe antenna 13 and, in turn, received by the AUT 14, is passed via the calibration system 84 and the switching system 86 to the receiving system 82 for measurement by the measurement instrument 16.

Calibration Measurement Mode

FIGS. 5 and 6C-6E show the respective switch positions for the operation of the preferred automatic measurement system 10 during selected measurements for the calibration mode. During the calibration mode, the probe antenna 13 and the AUT 14 are disconnected from the measurement system 10 to prevent the transmission of the test signal by either the probe antenna 13 or the AUT 14. Instead of the transmission of the test signal through free space, the calibration system 84 forms unique pairs of electrical cables, the first cable pair 32, the second cable pair 33, and the third cable pair 34, to establish three separate signal paths that pass the output of the transmitting system 80 via the switching system 86 to the receiving system 82 to enable calibration measurements.

Specifically, the measurement instrument 16 measures the output of each of the cable pairs 32, 33 and 34 that is produced by applying, in successive manner, the calibration signal $a_{CAL}$ produced by the signal source 15 on line 35 to each of the cable pairs. In this manner, a set of transfer functions is established by the calibration measurements to enable the calculation of the correction factor CF to correct for the variation of the antenna measurements induced by the flexing of the primary cable 18 or other environmental influences during the movement of the probe antenna 13.

Figure 6C:
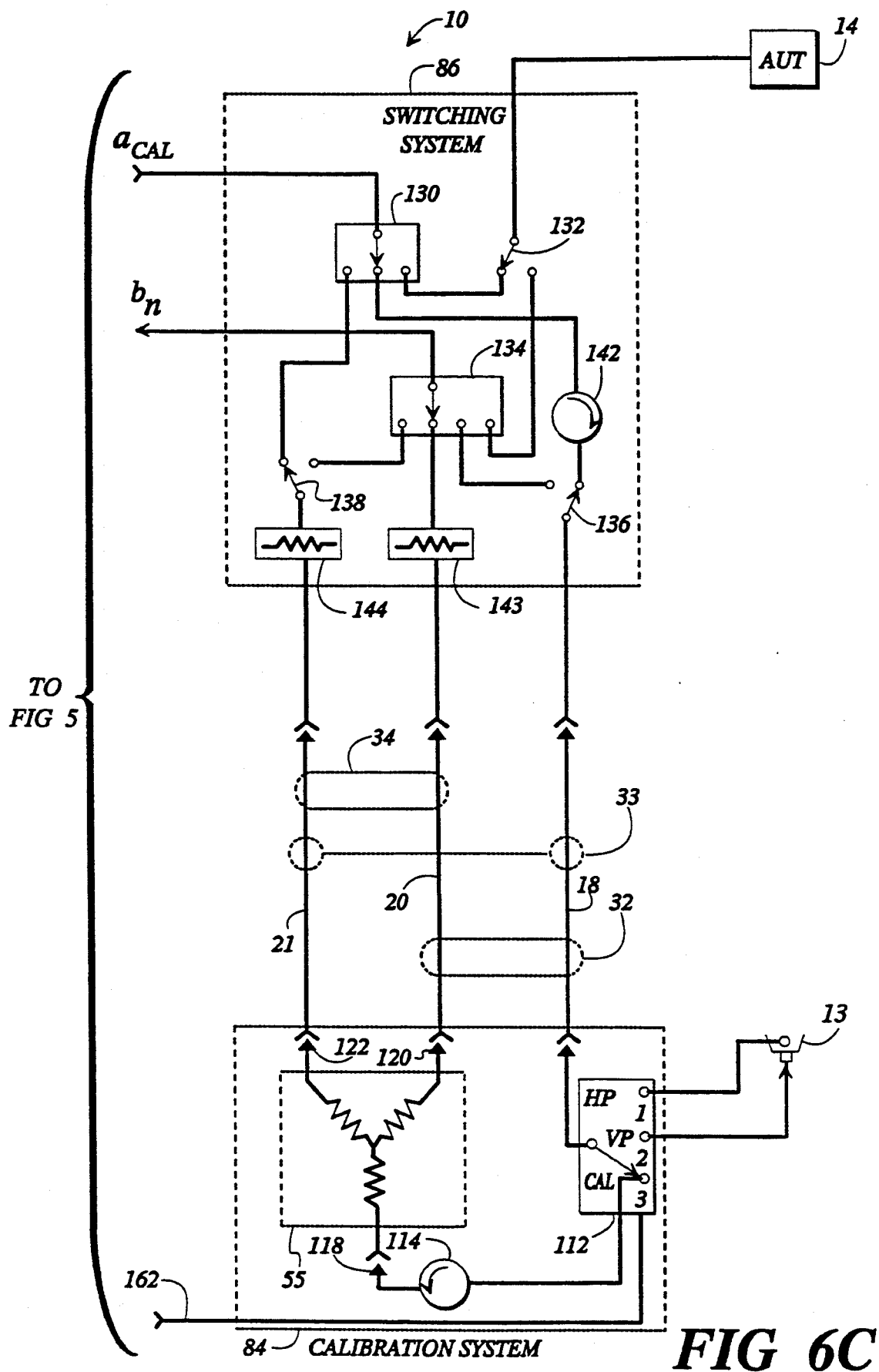
FIG. 6C is a block diagram of the calibration system and switching system for the preferred embodiment of the present invention, configured for conducting a first calibration measurement.

Referring to FIGS. 5 and 6C, which depict the calibration measurement for the first cable pair 32, otherwise referred to as the first calibration measurement, each of the switches associated with the calibration system 84 and the switching system 86 is positioned to provide a signal path between the transmitting system 80 and the receiving system 82 to enable the first cable pair measurement. In particular, the output of the transmitting system 80 is passed via the signal path formed by the source switch 130, the isolator 142, and the primary cable switch 136 to the primary cable 18. The primary cable 18, which extends between the calibration system 84 and the switching system 86, passes the output of the switching system 86 to the isolator 114 via the calibration switch 112.

The output of the calibration isolator 114 is divided by the power divider 55 and passed to both the first secondary cable 20 via the second port 120 and the second secondary cable 122 via the third port 122. The divided signal associated with the first secondary cable 20 is attenuated by an attenuator 143 and passed via the measurement switch 134 to the receiving system 82. The attenuator 143 further insures the proper impedance level between the first secondary cable 20 and the switching system 86.

In contrast, the measurement switch 134 interrupts the signal path between the receiving system 82 and the second secondary cable 21 to prevent the divided signal associated with the second secondary cable 21 from reaching the receiving system 80. In this manner, the measurement instrument 16 measures only the signal associated with the first cable pair 32. The signal transmitted through the first cable pair 32 is shaped by the characteristics of the first cable pair 32 and therefore represents the characteristics of both the primary cable 18 and the first secondary cable 20.

Figure 6D:
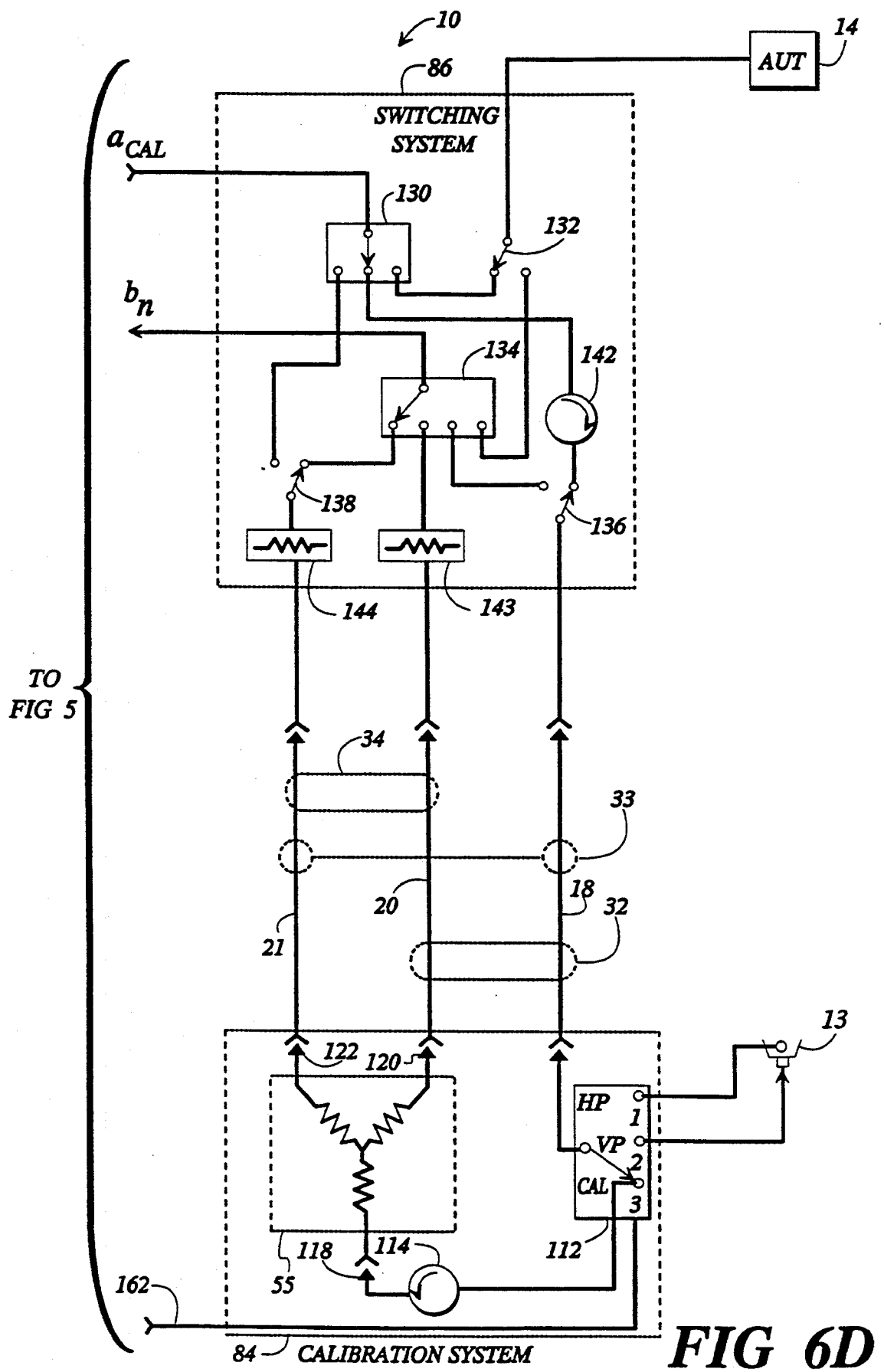
FIG. 6D is a block diagram of the calibration system and switching system for the preferred embodiment of the present invention, configured for conducting a second calibration measurement.

FIGS. 5 and 6D show the switch positions for the switches associated with the calibration system 84 and the switching system 86 during the measurement of the second cable pair 33, i.e., the second calibration measurement. Specifically, the output of the transmitting system 80 is passed along the signal path defined by the source switch 130, the isolator 142, and the primary cable switch 136 to provide an output signal to the primary cable 18. The calibration switch 112 passes the output of the primary cable 18 through the calibration isolator 114 to the first port 118 of the power divider 55. By dividing the output of the isolator 114 into two separate signal paths, a divided output signal is provided to the first secondary cable 20 and the second secondary cable 21.

The second secondary cable 21 provides the divided output signal to the switching system 86. An attenuator 144 attenuates the output of the second secondary cable 21 and passes the attenuated signal through the signal path provided by the combination of the second secondary cable switch 138 and the measurement switch 134 to the receiving system 82. The attenuator 144 provider provides a power leveling function insures a proper impedance match between the second secondary cable 21 and the switching system 86. In contrast, the switching system 86 prevents the divided output signal provided by the first secondary cable 21 from reaching the receiving system 82 by utilizing the measurement switch 134 to disconnect the signal path between the first secondary cable 20 and the receiving system 82. In this manner, the measurement instrument 16 conducts only a calibration measurement of the second cable pair 33.

Figure 6E:
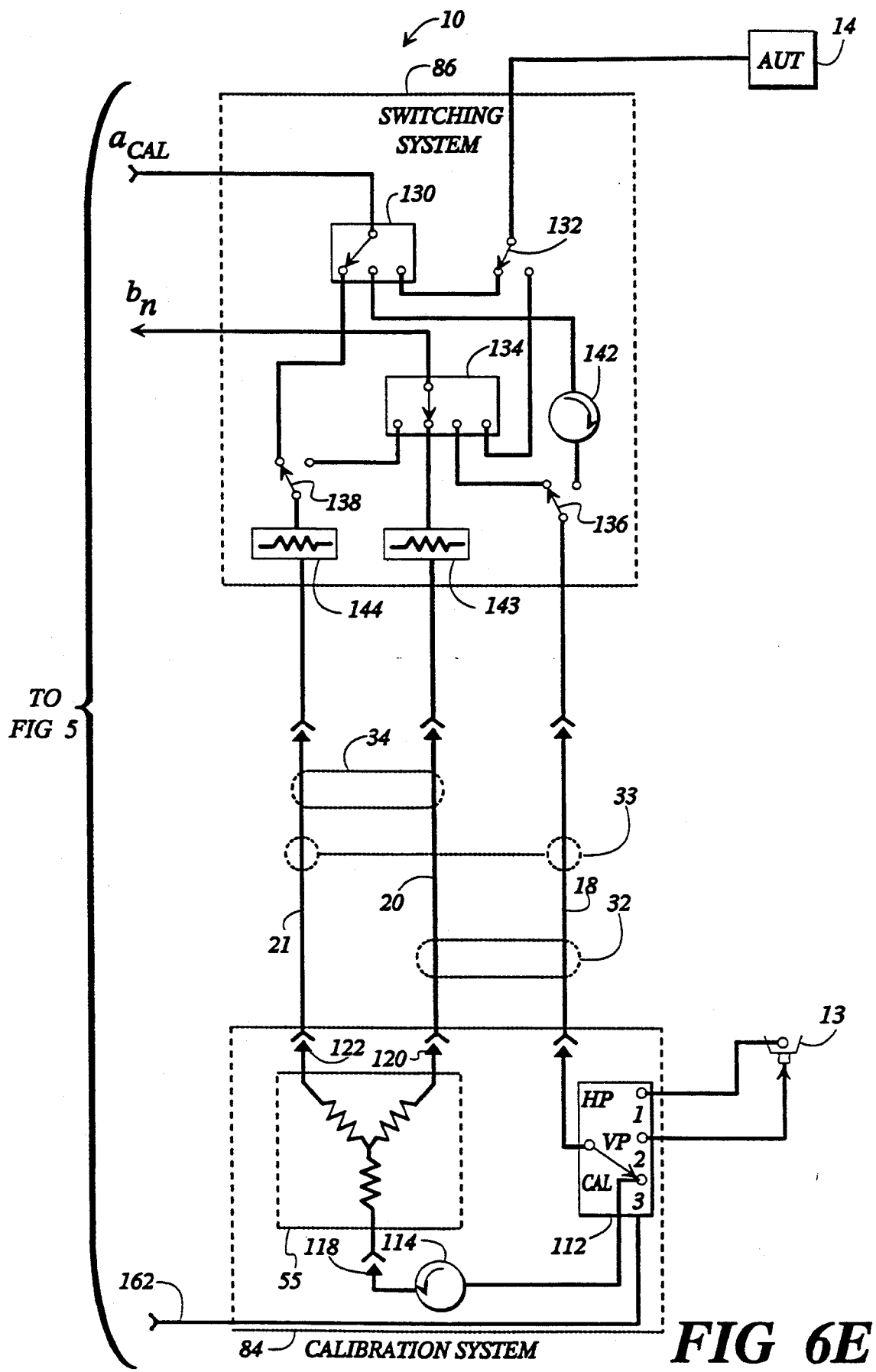
FIG. 6E is a block diagram of the calibration system and switching system for the preferred embodiment of the present invention, configured for conducting a third calibration measurement.

FIGS. 5 and 6E show the switch positions for the measurement of the third cable pair 34 during the calibration mode, otherwise referred to as the third calibration measurement. Specifically, the output of the transmitting system 80 is passed via the signal path formed by the combination of the source switch 130, the second secondary cable switch 138, and the attenuator 144 to the second secondary cable 21. The attenuated signal provided by the attenuator 144 passes through the second secondary cable 21 to the third port 122 of the power divider 55. The power divider 55 divides the output of the second secondary cable 21 and passes a divided signal to the first secondary cable 20. The output of the first secondary cable 20 is connected to the receiving system 82 via the signal path provided by the attenuator 143 and the measurement switch 134.

The calibration switch 112 interrupts the signal path between the primary cable 18 and the power divider 55 to prevent the divided output signal from passing through the primary cable 18. Furthermore, the isolator 114 isolates the first port 118 of the power divider 55 from the calibration switch 112. In this manner, the measurement instrument 16 measures the calibration signal applied to the third cable pair 34 to complete the set of three separate calibration measurements.

During the calibration mode, the preferred automatic measurement system 10 conducts calibration measurements in a successive fashion for each of the cable pairs until a calibration measurement is completed for the complete set of three cable pairs. Three calibration measurements associated with the set of three cable pairs, the first calibration measurement, the second calibration measurement, and the third calibration measurement, are conducted during a first time period ($t_1$). Upon completing the calibration measurements associated with each of the cable pairs, sufficient calibration data is available to establish the set of three transfer functions defined by the Equations 1, 2, and 3.

The foregoing steps are repeated for a second time period ($t_2$), to obtain calibration data associated with each of the cable pairs 32, 33, 34 and associated transfer functions pertinent to time period $t_2$.

The computing system 19 operates upon the calibration measurement data associated with each of the cable pairs 32, 33, 34 to determine the insertion factor for the primary cable 18 as a function of the calibration signal. By conducting calibration measurements of each of the cable pairs 32, 33, and 34 during two separate time periods, a first time period ($t_1$) and a second time period ($t_2$), the computing system 19 determines the insertion factor for the primary cable (as a function of the calibration signal) during the first time period ($t_1$) and the second time period ($t_2$). In particular, the computing system operates upon the set of three transfer functions defined by the Equations 1, 2, and 3 and the calibration measurement data to determine each insertion factor.

The computing system 19 also determines a ratio of the insertion factor $F_0(t_1)$ associated with the first time period to the insertion factor associated with the second time period $F_0(t_2)$ to determine a correction factor CF for the primary cable 18 in accordance with Equation 7. If it is assumed that the calibration signal $a_{CAL}$ is stable over time, the value of the calibration signal $a_{CAL}$ in Equations 4–6 associated with each insertion factor for the first time period and the second time period is cancelled by the ratio formed by the insertion factors in Equation 7 to produce the correction factor. Consequently, it is not necessary to measure the calibration signal prior to applying the calibration signal to each cable pair during the first time period and the second time period for the determination of the correction factor. Alternatively, $a_{CAL}$ may be obtained for each determination of the insertion factor $F_0$ for each time period by monitoring the reference channel to obtain and store $a_{REF}$ and by making use of $F_{PRE}$ and Equation 9. Those skilled in the art, after the foregoing discussion, will understand how to program the computing system 19 so as to obtain the insertion factors and correction factor CF.

After calculating the correction factor CF, the computing system 19 applies the correction factor to antenna measurement data acquired via the primary cable 18 and thereby compensates or adjusts the antenna measurement data for cable variations occurring during the time interval between the first time period and the second time period. In this manner, the computing system 19 insures a more accurate characterization of the parameters for the AUT 14.

Figure 7:
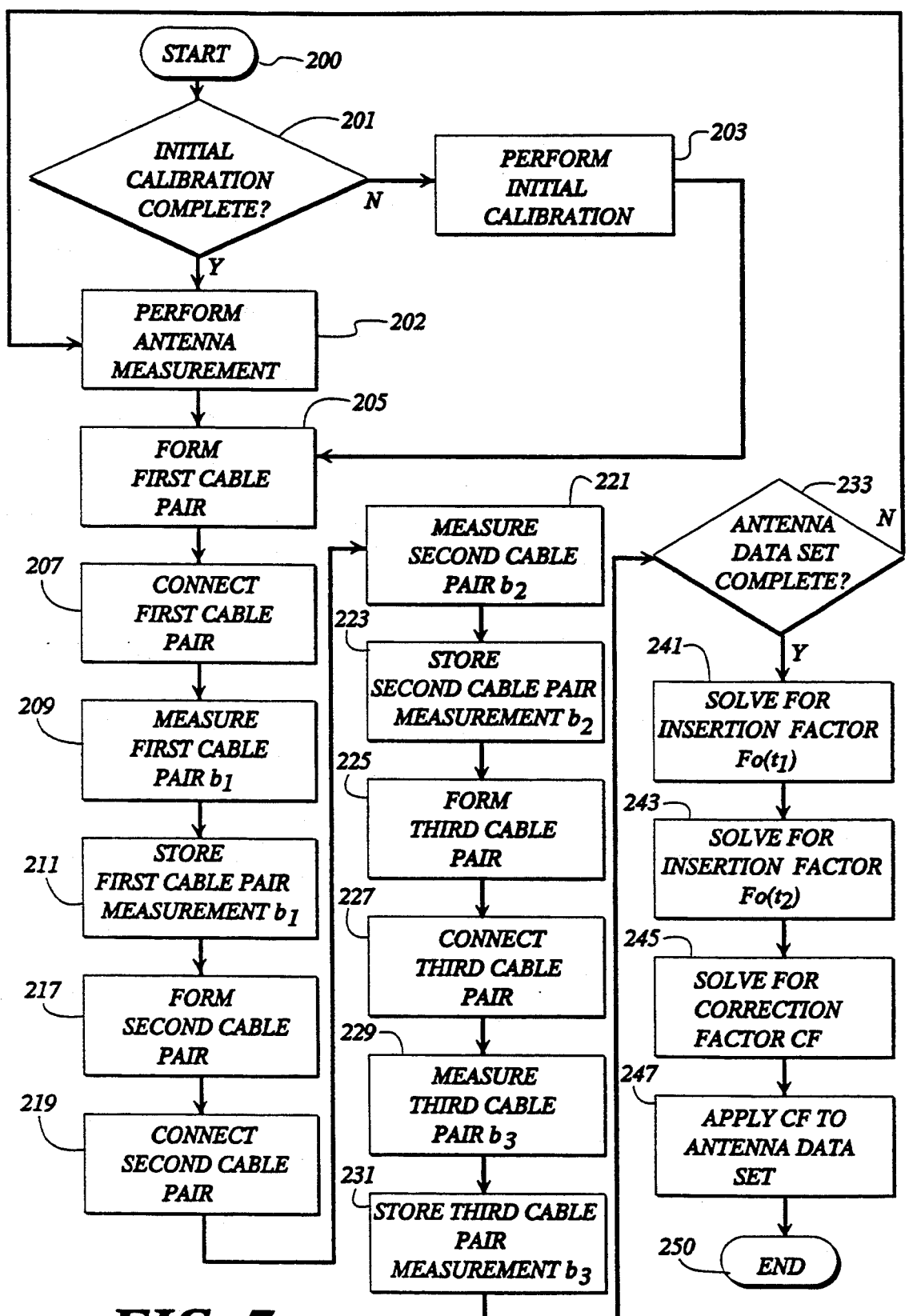
FIG. 7 is a flow chart illustrating the steps taken by the preferred embodiment, implemented as a computer program, for determining and applying a correction factor to data acquired by use of a primary device.

FIG. 7 illustrates the operation of the preferred automatic measurement system 10 to determine the correction factor for correcting cable variations associated with the primary cable 18. The steps illustrated in FIG. 7 are implemented as a computer program for the computing system 19, and it is believed that those skilled in the art will be enabled to program the preferred computing system to carry out the steps shown without undue experimentation, after reviewing the foregoing description of the apparatus and the following discussion. Starting at 200 in FIG. 7, the first inquiry at 201 is whether the automatic measurement system 10 has completed an initial calibration. This initial calibration obtains calibration data for an initial position $X_c$, $Y_c$ (see FIG. 8) at which a first calibration measurement is taken, prior to scanning an AUT. This initial position corresponds to an initial or starting position for the probe antenna 13, with the cables at an initial starting position configured for movement to the extremes of $X_{min}$ to $X_{max}$ and $Y_{min}$ to $Y_{max}$.

If the initial calibration has not been completed, at step 203 an initial calibration is performed, and the program branches to 205. If the initial calibration has been completed, the system at 202 performs an antenna measurement in its antenna measurement mode.

After conducting an antenna measurement, the system 10 exits the antenna measurement mode and enters the calibration mode. The steps taking during the calibration mode are set forth as steps 205–231.

In the calibration mode, the first step taken is at 205 where the first cable pair 32 is formed by connecting the primary cable 18 to the first secondary cable 20.

At step 207, the first cable pair 32 is connected between the output of the transmitting system 80 and the input to the receiving system 82 via the signal path provided by the calibration system 84 and the switching system 86. During step 209, the automatic measurement system 10 completes the first calibration measurement at step 209 by measuring the resultant calibration signal $b_1$ produced as a result of applying the calibration signal $a_{CAL}$ to the first cable pair 32. Upon completing the first calibration measurement at 209, the first calibration measurement is stored at step 211.

At step 217, the second cable pair 33 is formed by connecting the primary cable 18 to the second secondary cable 21. The second cable pair 33 is connected between the output of the transmitting system 80 and the input to the receiving system 82 via the signal path provided by the calibration system 84 and the switching system 86 during step 219. Similar to the first calibration measurement at 209, the automatic measurement system 10 measures the second cable pair at step 221 by measuring the resultant calibration signal $b_2$ that occurs upon the application of the calibration signal to the second cable pair 33. Upon completing this second calibration measurement, the second cable pair measurement value $b_2$ is stored for future application during step 223.

At step 225, the third cable pair 34 is formed by connecting the first secondary cable 20 to the second secondary cable 21. During step 227, the third cable pair 34 is connected between the output of the transmitting system 80 to the input of the receiving system 82 via the signal path provided by the calibration system 84 and the switching system 86.

At step 229, the automatic measurement system completes the measurement of the third cable pair 34 by measuring the resultant calibration signal $b_3$ produced by applying the calibration signal to the third cable pair 34. Upon completing this third calibration measurement, the third cable pair measurement value $b_3$ is stored during step 231.

At step 233, the inquiry is made whether the antenna data set is complete. In other words, has all data associated with measuring an AUT 14 in the antenna measurement mode been taken, so that a complete set of data associated with the AUT for all scan positions of the probe antenna 13 relative to the AUT? If not, the program branches back to step 202 and more measurements of the AUT are taken.

If on the other hand at 233 the antenna data set is complete, it is now time to determine and apply the correction factor CF. The steps for determining and applying the correction factor are set forth in steps 241–247 in FIG. 8.

At step 241, the computing system 19 operates to calculate the insertion factor $F_0$ (as a function of the calibration signal) associated with the first calibration measurement data set for time ($t_1$) by solving the transfer functions defined by the equations 1, 2, and 3. Likewise, at step 243, the computing system 19 operates to solve for the insertion factor $F_0$ (as a function of the calibration signal) associated with the second calibration measurement data set at time ($t_2$) by solving the transfer functions represented by the equations 1, 2, and 3. After solving for the insertion factor $F_0$ associated with time ($t_1$) during step 241 and the insertion factor $F_0$ associated with time ($t_2$) at step 243, the computing system solves for the correction factor CF at step 245. During step 247, the computing system 19 applies the correction factor CF to the antenna measurement data set acquired. The program then terminates at 250.

Figure 8:
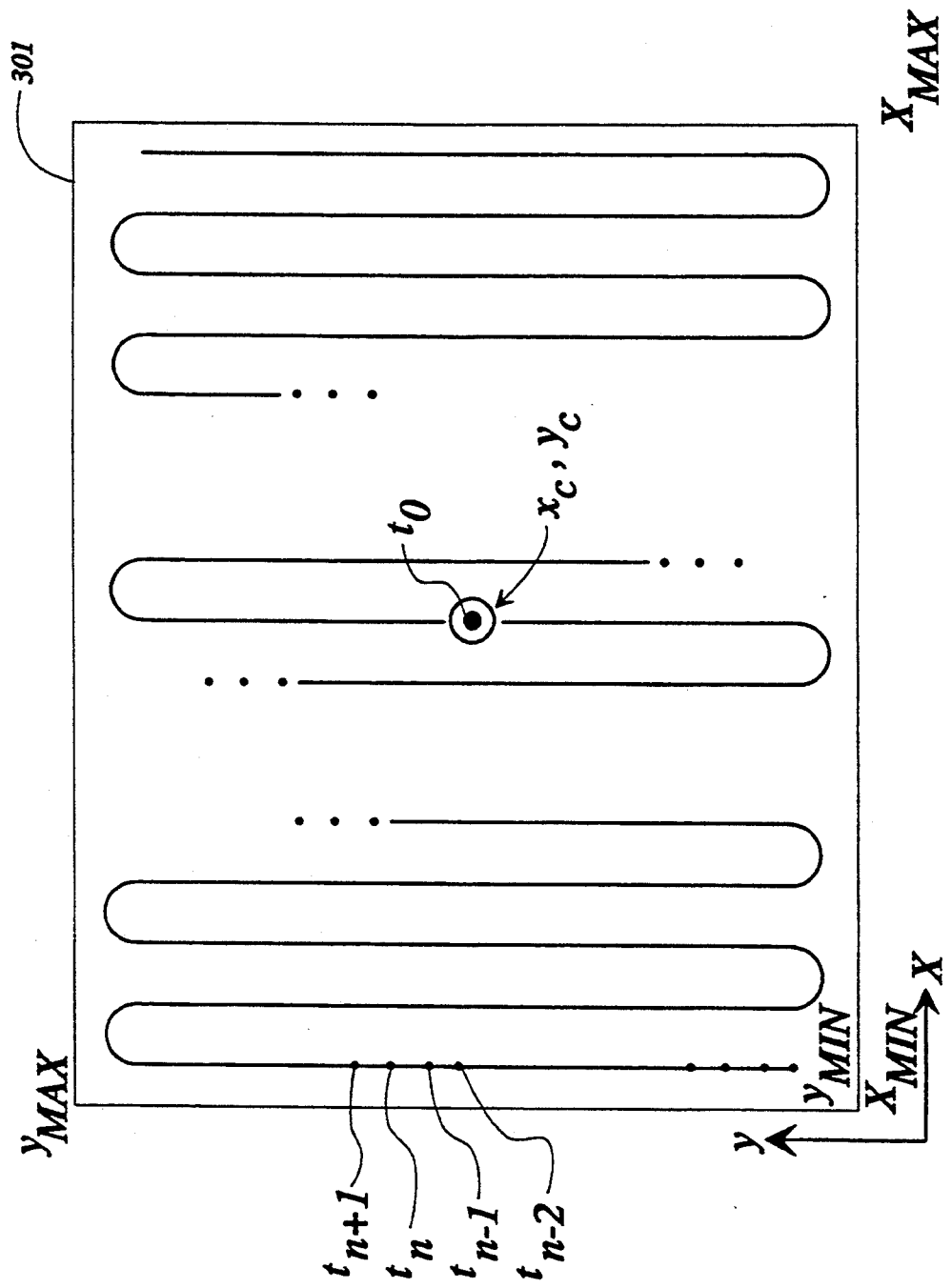
FIG. 8 graphically illustrates the relationship of an exemplary initial time to for making calibration measurements in a calibration mode relative to successive times $t_n$ in an antenna test mode, for purposes of determining the application of the correction factor to test data acquired during the antenna test mode.

Referring now to FIG. 8, it should be understood that various methods may occur to those skilled in the art as to the determination of a first time $t_1$ relative to any subsequent or successive time $t_2$. FIG. 8 illustrates an X-Y coordinate plane 301 which may be considered as a scanning field for an AUT. In other words, consider that the probe antenna 13 is capable of moving in the near field range 11 in the range from $X_{min}$ to $X_{max}$, and $Y_{min}$ to $Y_{max}$, for scanning the AUT and obtaining an antenna data set. Consider further that the centered position for the probe antenna in the range of movement is at the center of the plane 301, marked by the location $X_c$, $Y_c$. It is at this position that the cables (primary 18 and secondary 20, 21) connected to the probe antenna will be configured to allow for movement in either direction.

If it is assumed that the initial position $X_c$, $Y_c$ is a position at which a first calibration measurement is taken, prior to scanning an AUT, then let the first time $t_1$ be taken as $t_0$, where $t_0$ corresponds to an initial or starting position for the probe antenna 13, with the cables at an initial starting position configured for movement to the extremes of $X_{min}$ to $X_{max}$ and $Y_{min}$ to $Y_{max}$. After the probe antenna has begun its scan of the AUT, such as at times ... $t_{n-2}$, $t_{n-1}$, $t_n$, $t_{n+1}$ ..., the correction factor may be determined for each time ... $t_{n-2}$, $t_{n-1}$, $t_n$, $t_{n+1}$ ... separately relative to $t_0$. In other words, the first time $t_1$ for purposes of computing the correction factor can correspond to the initial position of the probe antenna at $t_0$, and the second time $t_2$ can correspond to any subsequent position of the probe antenna at times ... $t_{n-2}$, $t_{n-1}$, $t_n$, $t_{n+1}$ .... The correction factor CF is then determined in the manner described herein and applied to antenna test data or data set taken between the times ... $t_{n-2}$, $t_{n-1}$, $t_n$, $t_{n+1}$ ....

It should by now be understood that the operation of the switching means and computing means is so rapid with the preferred embodiments that the appropriate switching of the primary and secondary cables, applying the calibration signal $a_{CAL}$, computing the correction factor CF, etc. occurs during the motion of the probe antenna 13, and that the system is switching between the antenna measurement mode and the calibration mode to compute a correction factor, at or about the same time as the times . . . $t_{n-2}, t_{n-1}, t_n, t_{n+1}$ . . .

It should also be understood that the time $t_1$ can be a time such as $t_{n-1}$ in FIG. 8, the time $t_2$ can be a subsequent or successive time $t_n$, so that the computation and application of the correction factor CF relates to successive or proximate spatial positions of the probe antenna 13. Moreover, the correction factor can comprise a combination of correction factors, determined for various calibration times and positions of the probe antenna 13 relative to the AUT. Yet still further, the correction factor can be determined and applied for various polarizations of the probe antenna and test antenna. It will therefore be appreciated that the determination of the times $t_1$ and $t_2$ are relative and can vary from application to application.

From the foregoing, it will be appreciated that there has been disclosed a method for determining the insertion factor of a primary cable subjected to mechanical and/or environmental influences, comprising the steps of:

(1) connecting a primary cable to a first secondary cable to form a first cable pair;
(2) connecting the first cable pair between a signal source and a phase-amplitude receiver;
(3) applying a calibration signal from the signal source to the first cable pair to provide an output signal from the first cable pair;
(4) measuring the output signal from the first cable pair relative to a reference signal from the signal source;
(5) storing the measured output signal from the first cable pair in a memory as a stored first cable pair output signal;
(6) connecting the primary cable to a second secondary cable to form a second cable pair;
(7) connecting the second cable pair between the signal source and the phase-amplitude receiver;
(8) applying the calibration signal from the signal source to the second cable pair to provide an output signal from the second cable pair;
(9) measuring the output signal from the second cable pair relative to a reference signal from the signal source;
(10) storing the measured output signal from the second cable pair in the memory as a stored second cable pair output source;
(11) connecting the first secondary cable to the second secondary cable to form a third cable pair;
(12) connecting the third cable pair between the signal source and the phase-amplitude receiver;
(13) applying the calibration signal from the signal source to the third cable pair to provide an output signal from the third cable pair;
(14) measuring the output signal from the third cable pair relative to a reference signal from the signal source;
(15) storing the measured output signal from the third cable pair in the memory as a stored third cable pair output source;
(16) measuring the reference signal;
(17) storing the measured reference signal to provide a stored reference signal in the memory storage device; and
(18) operating upon a set of functions formed by a ratio of said stored first cable pair output signal to the stored reference signal, a ratio of the stored second cable pair output signal to the stored reference signal, and a ratio of the stored third cable pair output signal to the stored reference signal to determine the insertion factor for the primary cable.

It will be also understood that the steps of the method set forth immediately above, with the exception of the steps (16) measuring the reference signal, and (17) storing the measured reference signal to provide a stored reference signal in the memory storage device, may be carried out at successive time intervals to determine a correction factor for signals transmitted via the primary cable. Thus, a method for determining a correction factor comprises the steps (1) through (15) and (18), repeated during a second time period occurring subsequent to the first time period and subsequent to the acquisition of data via the primary cable.

The method for determining a correction factor thus preferably includes steps of operating upon functions formed by a ratio of the stored first output voltage to the stored reference signal for the first time period, a ratio of the stored second output voltage to the stored reference signal for the first time period, and a ratio of the stored third output voltage to the stored reference signal for the first time period, to determine the insertion factor for the primary cable during the first time period, operating upon functions formed by a ratio of the stored first output voltage to the stored reference signal for the second time period, a ratio of the stored second output voltage to the stored reference signal for the second time period, and a ratio of the stored third output voltage to the stored reference signal for the second time period, to determine the insertion factor for the primary cable during the second time period, calculating a ratio of the insertion factor during the first time period to the insertion factor during the second time period to provide a correction factor, and applying the correction factor to the measured data to improve the accuracy of the measured data.

It will also be appreciated that there has been disclosed apparatus for automatically correcting for variations of the insertion factor of a primary cable produced by mechanical and/or environmental influences upon the primary cable, to ensure the accuracy of measurement data acquired via said primary cable. The disclosed apparatus comprises a phase-amplitude receiver having at least a reference channel and a signal channel. A signal source provides calibration and reference signals, with the reference signal being connected to the reference channel of the receiver. Three independent cables are provided, including a primary cable, a first secondary cable, and a second secondary cable.

Connecting means are provided for connecting the primary cable to the first secondary cable to form a first cable pair, connecting the primary cable to the second secondary cable to form a second cable pair, and connecting the first secondary cable to the second secondary cable to form a third cable pair.

Switching means are provided for successively connecting each of the first cable pair, the second cable pair, and the third cable pair between the signal channel of the phase-amplitude receiver and the calibration signals during each of a first period and a successive period subsequent to the first period.

A controller automatically directs the switching operation of the switching means, for automatically directing the phase-amplitude receiver to measure a first output signal produced by passing calibration signals through the first cable pair during each of the first period and the second period, a second output signal produced by passing calibration signals through the second cable pair during each of the first period and the second period, and a third output signal produced by passing calibration signals through the third cable pair during each of the first period and the successive period.

A memory storage means is provided for storing each of the first output signal, the second output signal, and the third output signal, and the reference signal to provide a first stored output signal, a second stored output signal, a third stored output signal, and a stored reference signal during each of the first period and the successive period.

A computing means then determines an insertion factor for each of the first period and the successive period by operating upon a first set of transfer functions and a second set of transfer functions, each transfer function within the first set defined by a selected one of the first stored output signal, the second stored output signal, and the third stored output signal for the first period and the stored reference signal for the first period, and each transfer function within the second set defined by a selected one of the first stored output signal, the second stored output signal, and the third stored output signal for the successive period and the stored reference signal for the successive period, and then operating upon the insertion factor for the first period and the insertion factor for the successive period to determine a cable correction factor. The computing means applies the cable correction factor to the measurement data to correct for variations in the primary cable.

It will be appreciated that the first set of transfer functions is defined by
(i) a ratio of the first stored output signal to the stored reference signal for the first period,
(ii) a ratio of the second stored output signal to the stored reference signal for the first period, and
(iii) a ratio of the third stored output signal to the stored reference signal for the first period, and
the second set of transfer functions is defined by
(i) a ratio of the first stored output signal to the stored reference signal for the successive period,
(ii) a ratio of the second stored output signal to the stored reference signal for the successive period, and
(iii) a ratio of the third stored output signal to the stored reference signal for the successive period.

The computing means determines the cable correction factor by calculating a ratio of the insertion factor during the first period to the insertion factor during the successive period.

From the foregoing description of the preferred embodiment, it will be appreciated that the present invention overcomes the disadvantages of the prior art and achieves the objects and advantages of the invention recited above. From the description, other embodiments will suggest themselves to those skilled in the art. Therefore, the scope of the present invention is to limited only by the claims below.

What is claimed is:

1. Apparatus for determining a characteristic associated with a primary confined path signal transmitting device subjected to an influence affecting the transfer characteristics of the primary confined path signal transmitting device, comprising:
   a plurality of other confined path signal transmitting devices also subjected to said influence;
   means for connecting said primary confined path signal transmitting device and said plurality of other confined path signal transmitting devices to form pairs of said devices; and
   means for comparing signals transmitted through said pairs of said devices to determine a characteristic associated exclusively with said primary confined path signal device.

2. The apparatus of claim 1, wherein said signals transmitted through said pairs of said devices comprise calibration signals normalized to a reference signal.

3. The apparatus of claim 2, wherein said calibration signal comprises a sinusoidal signal having a predetermined maximum amplitude and a predetermined constant frequency.

4. The apparatus of claim 1, wherein said comparing means comprises a phase-amplitude receiver.

5. The apparatus of claim 1, wherein said primary confined path signal transmitting device is an electrical cable.

6. The apparatus of claim 5, wherein the influence includes flexing, twisting, extending, straining, compressing, deforming, or otherwise altering the cable, or temperature, pressure, humidity, or other influences affecting the transfer characteristics of the cable.

7. The apparatus of claim 5, wherein the electrical cable is utilized for transmitting signals whose amplitude and phase characteristics are sensitive to motion of the cable.

8. The apparatus of claim 7, wherein the signals are microwave frequency signals.

9. The apparatus of claim 1, further comprising means for determining a correction factor for said primary confined path signal transmitting device.

10. The apparatus of claim 9, wherein said primary confined path signal transmitting device is an electrical cable utilized for transmitting test data associated with a device under test in an antenna test range, and further comprising means for applying said correction factor to said test data to adjust for the influence upon said electrical cable.

11. The apparatus of claim 9, wherein said correction factor determining means comprises a programmed computing means that is automatically operative to determine said correction factor during a calibration mode and is thereafter automatically operative in an operational mode for applying said correction factor to data transmitted via said primary confined path signal transmitting device to obtain data adjusted for the.

12. The apparatus of claim 11, wherein said primary confined path signal transmitting device is utilized for transmitting a plurality of test data readings associated with a device under test, and wherein said correction factor determining means is automatically operative for applying said correction factor to each of said plurality of test data readings.

13. The apparatus of claim 12, wherein the device under test is a test antenna that is scanned by a probe antenna in an antenna test range, wherein said plurality of test data readings comprise data associated with an X-Y scan of the test antenna.

14. The apparatus of claim 12, wherein said correction factor determining means is automatically operative for determining and applying a new correction factor for each of said plurality of test data readings.

15. The apparatus of claim 1, wherein said primary confined path signal transmitting device and said other confined path signal transmitting devices are similar confined path signal transmitting devices, and wherein said connecting means comprises:
- means for connecting a one of said plurality of confined path signal transmitting devices to a second one of said plurality of confined path signal transmitting devices to form a connected pair of said confined path signal transmitting devices, and
- switching means for successively connecting a plurality of said connected pairs between a signal source and a measurement instrument, said signal source providing a calibration signal applied to said connected pairs to provide measurement signals to said measurement instrument.

16. The apparatus of claim 15, wherein a portion of each of said primary and said other confined path signal transmitting devices is remotely located relative to said measurement instrument, and wherein said connecting means is remotely located.

17. The apparatus of claim 16, wherein said remotely located connecting means is operative in response to control signals from a control means for automatically connecting said confined path signal transmitting devices to form said connected pairs.

18. The apparatus of claim 1, wherein said other confined path signal transmitting devices comprise similar but not necessarily identical signal confined path signal transmitting devices.

19. The apparatus of claim 18, wherein said primary confined path signal transmitting device and said other confined path signal transmitting devices comprise similar electrical cables.

20. The apparatus of claim 18, wherein at least one of said primary or said other confined path signal transmitting devices comprises a signal transmitting optical fiber.

21. Apparatus for automatically determining a selected characteristic of a primary electrical device, comprising:
- a plurality of independent electrical devices, including said primary electrical device;
- means for connecting said plurality of electrical devices to form a plurality of pairs of said electrical devices in a succession;
- means for measuring an electrical characteristic of each of said plurality of pairs of said electrical devices in said succession and for providing measured electrical characteristics associated with each of said pairs, and
- computing means for comparing said measured electrical characteristics associated with each of said pairs to determine said selected characteristic of said primary electrical device.

22. Apparatus for automatically determining a characteristic associated with a primary signal transmitting device subjected to an influence affecting the transfer characteristics of said primary signal transmitting device, comprising:
- a plurality of other signal transmitting devices also subjected to said influence;
- means for automatically connecting said primary signal transmitting device and said plurality of other signal transmitting devices to form pairs of said devices; and
- means for automatically comparing signals transmitted through said pairs of said devices to determine a characteristic associated exclusively with said primary signal transmitting device.

23. Apparatus for automatically correcting for variation of a selected characteristic of a primary electrical device to improve the accuracy of measurement data acquired via said primary electrical device, comprising:
- a measurement instrument;
- a signal source;
- a plurality of independent electrical devices, including said primary electrical device, each of said electrical devices having similar electrical characteristics and being subjected to similar environmental influences;
- connecting means for successively connecting said electrical devices to provide a plurality of connected pairs of said electrical devices;
- switching means for successively connecting said connected pairs between said signal source and said measurement instrument;
- means for applying a signal from said signal source to said connected pairs to provide a measurement signal to said measurement instrument during a first period and a successive period subsequent to said first period;
- means for automatically directing said switching means during each of said first period and said successive period to successively connect each of said connected pairs between said signal source and said measurement instrument,
- said measurement instrument being responsive to said measurement signals during said first period and said successive period to provide, respectively, a first measurement signal and a second measurement signal associated with each of said connected pairs; and
- computing means for determining said selected characteristic for said first period and said successive period in response to said first measurement signals, said second measurement signals, and a reference signal from said signal source,
- said computing means being further operative for determining a correction factor based upon said selected characteristic for said first period and said second period.

24. The apparatus of claim 23, further comprising means for applying said correction factor to said measurement data to correct for variations in said primary electrical device.

25. The apparatus of claim 23, further comprising memory means for storing said first measurement signals and said second measurement signals as stored signals, and
- wherein said computing means is operative to determine said correction factor based on said stored signals.

26. The apparatus of claim 23, wherein said computing means determines said selected characteristic for said first period and said successive period by determining a first set of transfer functions associated with said first period and a second set of transfer functions associated with said successive period,
- said first set of transfer functions defined by said first measurement signals and said reference signal, and said second set of transfer functions associated with said second measurement signals and said reference signal.

27. The apparatus of claim 23, wherein said measurement instrument includes a reference channel and a signal channel,
wherein said reference signal is applied to said reference channel, and
wherein said switching means successively connects each of said connected pairs between said signal source and said signal channel.

28. A method for determining a characteristic associated with a primary confined path signal transmitting device subjected to an influence affecting the transfer characteristics of said primary confined path signal transmitting device, comprising the steps of:
providing a plurality of other confined path signal transmitting devices also subjected to said influence;
connecting said primary confined path signal transmitting device and said plurality of other confined path signal transmitting devices to form pairs of said devices; and
comparing signals transmitted through said pairs of said devices to determine a characteristic associated exclusively with said primary confined path signal transmitting device.

29. The method of claim 28, wherein said signals transmitted through said pairs of said devices comprise calibration signals normalized to a reference signal.

30. The method of claim 29, wherein said calibration signals comprise a sinusoidal signal having a predetermined maximum amplitude and a predetermined constant frequency.

31. The method of claim 28, wherein the step of comparing signals transmitted through said pairs of said devices is carried out with a phase-amplitude receiver.

32. The method of claim 28, wherein said primary confined path signal transmitting device is an electrical cable.

33. The method of claim 32, wherein the influence includes flexing, twisting, extending, straining, compressing, deforming, or otherwise altering the cable, or temperature, pressure, humidity, or other influences affecting the transfer characteristics of the cable.

34. The method of claim 32, wherein the electrical cable is utilized for transmitting signals whose amplitude and phase characteristics are sensitive to motion of the cable.

35. The method of claim 34, wherein the signals are microwave frequency signals.

36. The method of claim 28, further comprising the step of determining a correction factor for said primary confined path signal transmitting device.

37. The method of claim 36, wherein said primary confined path signal transmitting device is an electrical cable utilized for transmitting test data associated with a device under test in an antenna test range, and further comprising the step of applying the correction factor to the test data to adjust for the influence upon said electrical cable.

38. The method of claim 36, wherein the steps of determining and applying the correction factor are carried out with a programmed computing means that is automatically operative to determine the correction factor during a calibration mode and is thereafter automatically operative in an operational mode for applying the correction factor to data transmitted via the primary confined path signal transmitting device to obtain data adjusted for the influence.

39. The method of claim 38, wherein the primary confined path signal transmitting device is utilized for transmitting a plurality of test data readings associated with a device under test, and wherein the programmed computing means is automatically operative for applying the correction factor to each of said plurality of test data readings.

40. The method of claim 39, wherein the device under test is a test antenna that is scanned by a probe antenna in an antenna test range, wherein said plurality of test data readings comprise data associated with an X-Y scan of the test antenna.

41. The method of claim 39, wherein the programmed computing means is automatically operative for determining and applying a new correction factor for each of said plurality of test data readings.

42. The method of claim 28, wherein said primary confined path signal transmitting device and said other confined path signal transmitting devices are similar confined path signal transmitting devices, and further comprising the steps of:
connecting one of the plurality of confined path signal transmitting devices to a second one of the plurality of confined path signal transmitting devices to form a connected pair of the confined path signal transmitting devices, and
successively connecting a plurality of the connected pairs between a signal source and a measurement instrument, the signal source providing a calibration signal applied to the connected pairs to provide measurement signals to said measurement instrument.

43. The method of claim 42, wherein a portion of each of the primary and the other confined path signal transmitting devices is remotely located relative to the measurement instrument, and wherein the step of connecting one of the plurality of confined path signal transmitting devices to a second one of the plurality of confined path signal transmitting devices to form a connected pair of the confined path signal transmitting devices is carried out at the remote location.

44. The method of claim 43, wherein the step of connecting one of the plurality of confined path signal transmitting devices to a second one of the plurality of confined path signal transmitting devices to form a connected pair of the confined path signal transmitting devices is carried out in response to control signals from a control means.

45. The method of claim 28, wherein the other confined path signal transmitting devices comprise similar but not necessarily identical signal confined path signal transmitting devices.

46. The method of claim 45, wherein the primary confined path signal transmitting device and the other confined path signal transmitting devices comprise similar electrical cables.

47. The method of claim 28, wherein at least one of said primary or said other confined path signal transmitting devices comprises a signal transmitting optical fiber.

48. A method for compensating for influences upon a primary electrical cable utilized for transmitting signals from a device under test (DUT), comprising the steps of:
determining an electrical characteristic of the primary electrical cable at a first time by making calibration measurements of a plurality of similarly influenced electrical cables connected in pair-wise fashion;

making a test measurement of the DUT at a subsequent time interval using the primary electrical cable to obtain test data associated with the DUT;

determining the electrical characteristic of the primary electrical cable at a time subsequent to the test measurement by making calibration measurements of the plurality of similarly influenced electrical cables connected in pair-wise fashion;

computing a correction factor associated with the primary electrical cable; and applying the correction factor to the test data associated with the DUT to obtain corrected DUT test data.

49. The method of claim 48, wherein the influence includes flexing, twisting, extending, straining, compressing, deforming, or otherwise altering the cable, or temperature, pressure, humidity, or other influences affecting the transfer characteristics of the cable.

50. The method of claim 48, wherein the primary electrical cable is utilized for transmitting signals whose amplitude and phase characteristics are sensitive to motion of the cable.

51. The method of claim 48, wherein the signals are microwave frequency signals.

52. The method of claim 48, wherein the steps of computing and applying the correction factor are carried out with a programmed computing means that is automatically operative to determine the correction factor during a calibration mode and is thereafter automatically operative in an operational mode for applying the correction factor to data transmitted via the primary electrical cable device to obtain data adjusted for the influence.

53. The method of claim 52, wherein the primary electrical cable is utilized for transmitting a plurality of test data readings associated with the DUT, and wherein the programmed computing means is automatically operative for applying the correction factor to each of the plurality of test data readings.

54. The method of claim 53, wherein the DUT is a test antenna that is scanned by a probe antenna in an antenna test range, wherein the plurality of test data readings comprise data associated with an X-Y scan of the test antenna.

55. The method of claim 52, wherein the computing means is automatically operative for determining and applying a new correction factor for each of the plurality of test data readings.

56. A method for determining the insertion factor of a primary cable subjected to influences affecting the transfer characteristics of the primary cable, comprising the steps of:

connecting the primary cable to a first secondary cable to form a first cable pair;

connecting the first cable pair between a signal source and a phase-amplitude receiver;

applying a calibration signal from the signal source to the first cable pair to provide an output signal from the first cable pair;

measuring the output signal from the first cable pair relative to a reference signal from the signal source;

storing the measured output signal from the first cable pair in a memory as a stored first cable pair output signal;

connecting the primary cable to a second secondary cable to form a second cable pair;

connecting the second cable pair between the signal source and the phase-amplitude receiver;

applying the calibration signal from the signal source to the second cable pair to provide an output signal from the second cable pair;

measuring the output signal from the second cable pair relative to a reference signal from the signal source;

storing the measured output signal from the second cable pair in the memory as a stored second cable pair output signal;

connecting the first secondary cable to the second secondary cable to form a third cable pair;

connecting the third cable pair between the signal source and the phase-amplitude receiver;

applying the calibration signal from the signal source to the third cable pair to provide an output signal from the third cable pair;

measuring the output signal from the third cable pair relative to a reference signal from the signal source;

storing the measured output signal from the third cable pair in the memory as a stored third cable pair output signal;

measuring the reference signal;

storing the measured reference signal to provide a stored reference signal in the memory storage device; and operating upon a set of functions formed by a ratio of said stored first cable pair output signal to the stored reference signal, a ratio of the stored second cable pair output signal to the stored reference signal, and a ratio of the stored third cable pair output signal to the stored reference signal to determine the insertion factor for the primary cable.

57. The method of claim 56, wherein the steps of the method are carried out at successive time intervals to obtain a first insertion factor and a second insertion factor, and further comprising the step of determining a correction factor for signals transmitted via the primary cable based upon the first insertion factor and the second insertion factor.

58. A method for automatically correcting for variations of a primary cable to ensure the accuracy of measured data acquired via the primary cable, comprising the steps:

(1) connecting the primary cable to a first secondary cable to form a first cable pair;

(2) applying a calibration signal to the first cable pair to provide a first voltage output;

(3) measuring the first output voltage during the first time interval;

(4) storing the first output voltage to provide a stored first output voltage associated with a first time period;

(5) connecting the primary cable to a second secondary cable to form a second cable pair, (6) applying the calibration signal to the second cable pair to provide a second voltage output;

(7) measuring the second output voltage;

(8) storing the second output voltage to provide a stored second output voltage associated with the first time period;

(9) connecting the first secondary cable to the second secondary cable to form a third cable pair;

(10) applying the calibration signal to the third cable pair to provide a third voltage output;

(11) measuring the third output voltage;
(12) storing the third output voltage to provide a stored third output voltage associated with the first time period;
(13) measuring a reference signal corresponding to the calibration signal;
(14) storing the reference signal to provide a stored reference signal associated with the first time period;
(15) acquiring measured data via the primary cable;
(16) repeating steps (1)–(14) during a second time period occurring subsequent to the first time period and subsequent to the acquisition of data via the primary cable to obtain a stored first output voltage, a stored second output voltage, and a stored third output voltage associated with the second time period;
(17) operating upon functions formed by a ratio of the stored first output voltage to the stored reference signal for the first time period, a ratio of the stored second output voltage to the stored reference signal for the first time period, and a ratio of the stored third output voltage to the stored reference signal for the first time period, to determine the insertion factor for the primary cable during the first time period;
(18) operating upon functions formed by a ratio of said stored first output voltage to the stored reference signal for the second time period, a ratio of the stored second output voltage to the stored reference signal for the second time period, and a ratio of the stored third output voltage to the stored reference signal for the second time period, to determine the insertion factor for the primary cable during the second time period;
(19) calculating a ratio of the insertion factor during the first time period to the insertion factor during the second time period to provide a correction factor; and
(20) applying the correction factor to the measured data to improve the accuracy of the measured data.

* * * * *